(12) United States Patent
Wang et al.

(10) Patent No.: US 12,471,315 B2
(45) Date of Patent: Nov. 11, 2025

(54) SEMICONDUCTOR DEVICE INCLUDING SPACERS ON SIDES OF DIELECTRIC STRUCTURE AND MANUFACTURING METHOD THEREOF

(71) Applicant: TAIWAN SEMICONDUCTOR MANUFACTURING COMPANY, LTD., Hsinchu (TW)

(72) Inventors: Chih-Hao Wang, Baoshan Township (TW); Chun-Yuan Chen, Hsinchu (TW); Huan-Chieh Su, Tianzhong Township (TW); Sheng-Tsung Wang, Hsinchu (TW); Lo-Heng Chang, Hsinchu (TW); Kuo-Cheng Chiang, Zhubei (TW)

(73) Assignee: TAIWAN SEMICONDUCTOR MANUFACTURING COMPANY, LTD., Hsinchu (TW)

( * ) Notice: Subject to any disclaimer, the term of this patent is extended or adjusted under 35 U.S.C. 154(b) by 611 days.

(21) Appl. No.: 17/891,039

(22) Filed: Aug. 18, 2022

(65) Prior Publication Data
US 2023/0411490 A1    Dec. 21, 2023

Related U.S. Application Data

(60) Provisional application No. 63/342,790, filed on May 17, 2022.

(51) Int. Cl.
H10D 30/67    (2025.01)
H10D 30/01    (2025.01)
(Continued)

(52) U.S. Cl.
CPC ....... H10D 30/6735 (2025.01); H10D 30/014 (2025.01); H10D 30/43 (2025.01);
(Continued)

(58) Field of Classification Search
CPC ................. H10D 30/01; H10D 30/014; H10D 30/019–0198; H10D 30/0273; H10D 30/43; H10D 30/435; H10D 30/501–509; H10D 30/6735; H10D 30/6739; H10D 62/121; H10D 64/015; H10D 64/017; H10D 64/018; H10D 64/021; H10D 64/251; H10D 84/01; H10D 84/0128; H10D 84/0135; H10D 84/0144; H10D 84/0149;
(Continued)

(56) References Cited

U.S. PATENT DOCUMENTS

2021/0226020 A1    7/2021  Lin et al.

*Primary Examiner* — Cheung Lee
(74) *Attorney, Agent, or Firm* — STUDEBAKER BRACKETT PLLC

(57) ABSTRACT

In a method of manufacturing a semiconductor device, a FET structure is formed over a substrate, which includes a plurality of semiconductor sheets vertically arranged over a bottom fin structure, a gate dielectric layer wrapping around each of the plurality of semiconductor sheets, a gate electrode disposed over the gate dielectric layer and a source/drain structure. A gate cap conductive layer is formed over the gate electrode, the bottom fin structure is replaced with a dielectric fin structure, spacers are formed on opposite sides of the dielectric fin structure, a trench is formed by etching the gate electrode using the dielectric fin and the spacers as an etching mask until the gate cap conductive layer is exposed, and the trench is filled with a first dielectric material.

20 Claims, 28 Drawing Sheets

(51) Int. Cl.
  *H10D 30/43* (2025.01)
  *H10D 64/01* (2025.01)
  *H10D 84/01* (2025.01)
  *H10D 84/03* (2025.01)
  *H10D 62/10* (2025.01)

(52) U.S. Cl.
  CPC ....... *H10D 30/6739* (2025.01); *H10D 64/015* (2025.01); *H10D 64/017* (2025.01); *H10D 64/018* (2025.01); *H10D 64/021* (2025.01); *H10D 84/0135* (2025.01); *H10D 84/0144* (2025.01); *H10D 84/0149* (2025.01); *H10D 84/038* (2025.01); *H10D 62/121* (2025.01); *H10D 84/0128* (2025.01)

(58) Field of Classification Search
  CPC .. H10D 84/0151; H10D 84/02; H10D 84/032; H10D 84/035; H10D 84/038; H10D 84/05; H10D 84/07; H10D 84/08
  See application file for complete search history.

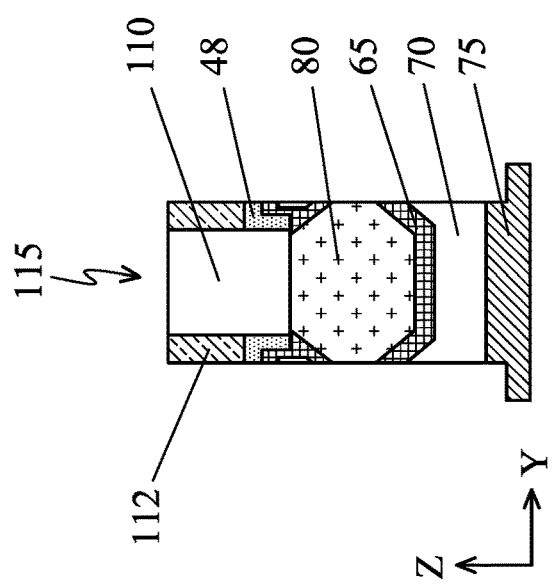
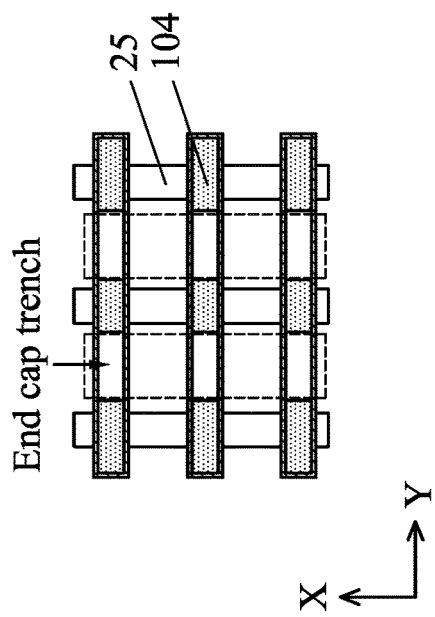
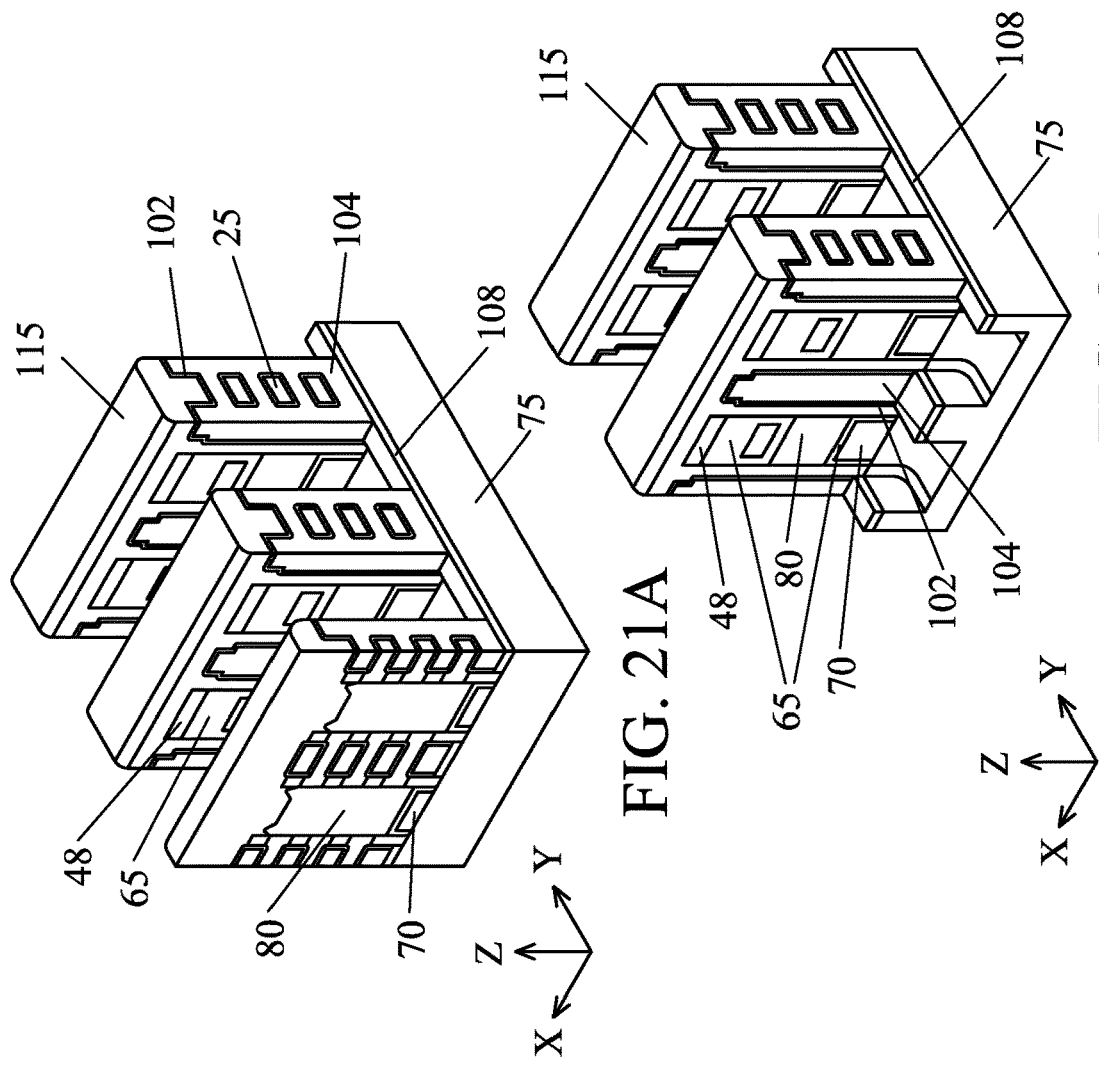
FIG. 22B
FIG. 21C
FIG. 21A
FIG. 21D

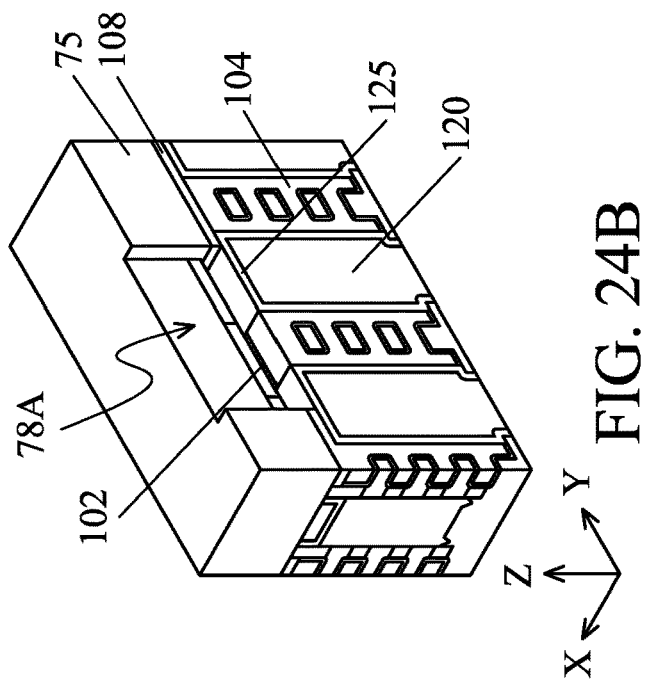
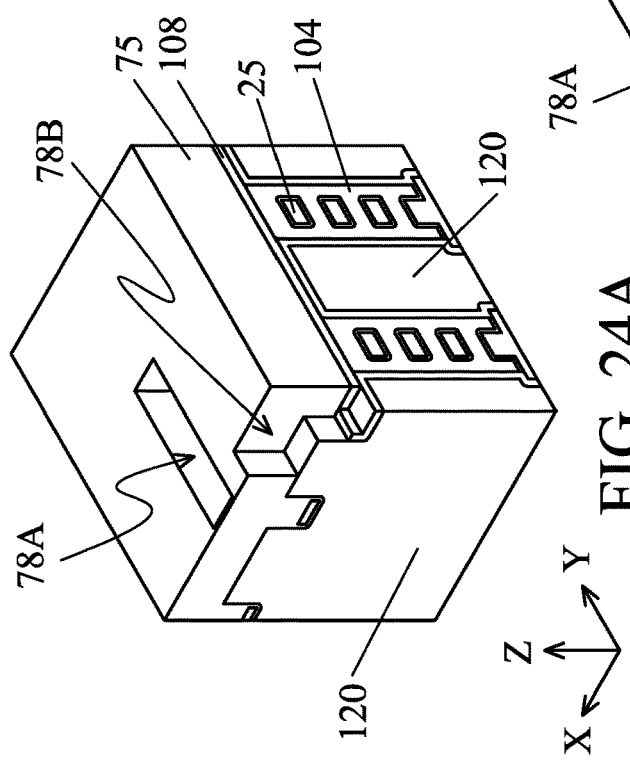
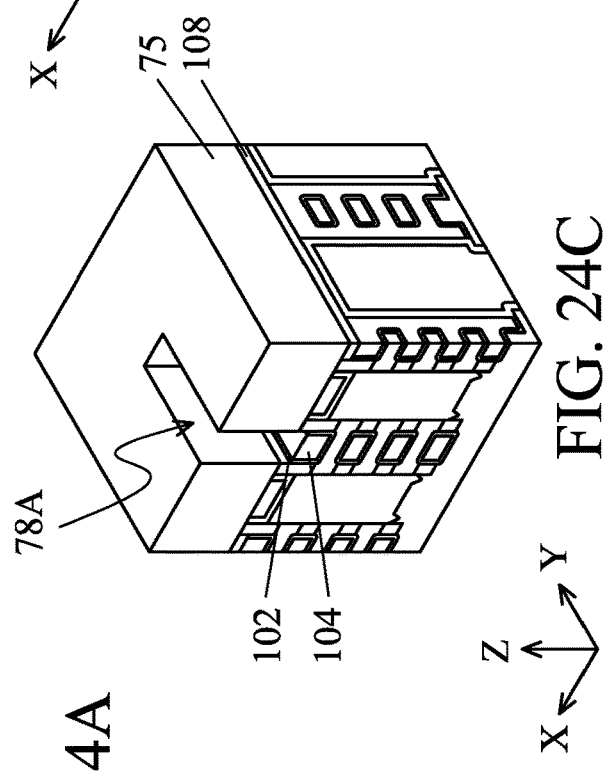
FIG. 24A
FIG. 24B
FIG. 24C

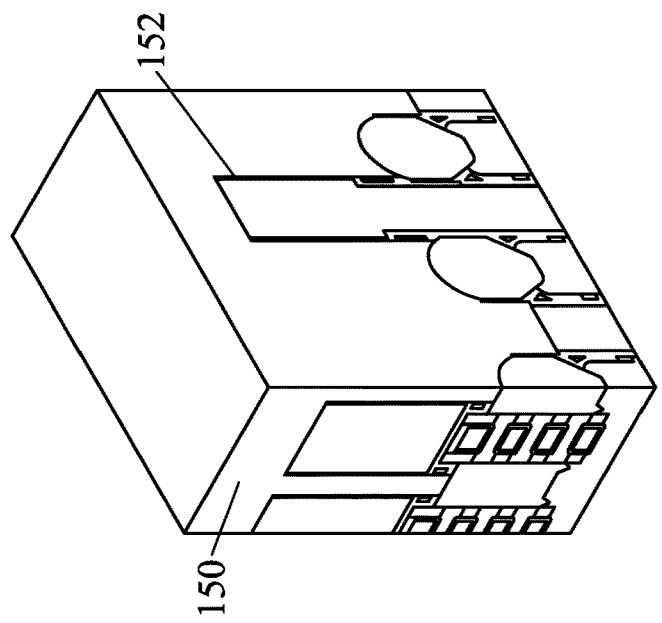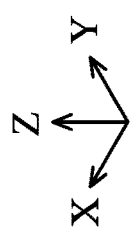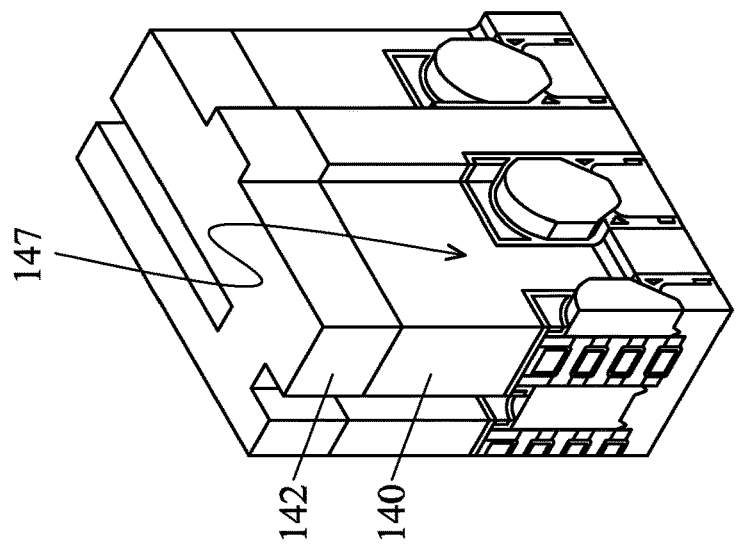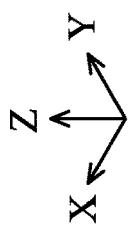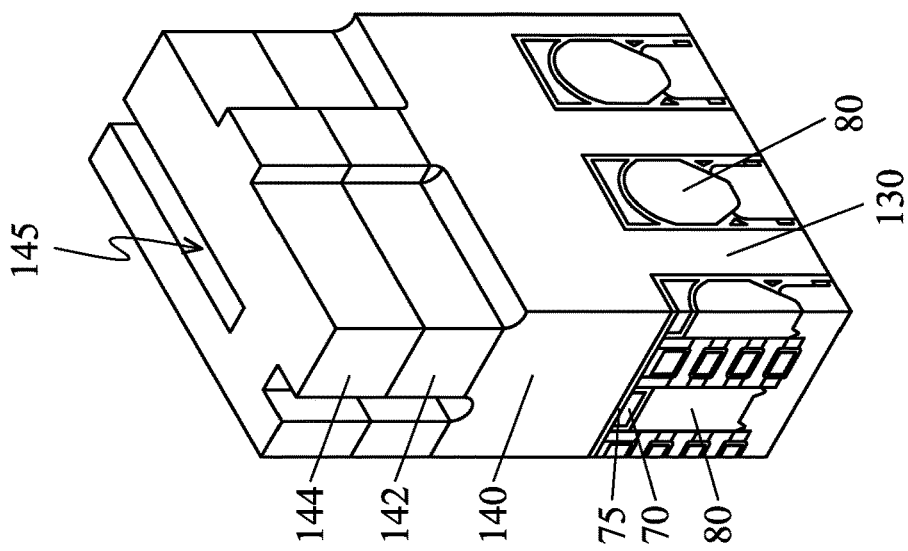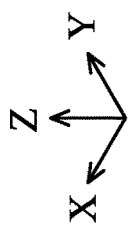
FIG. 28   FIG. 29   FIG. 30

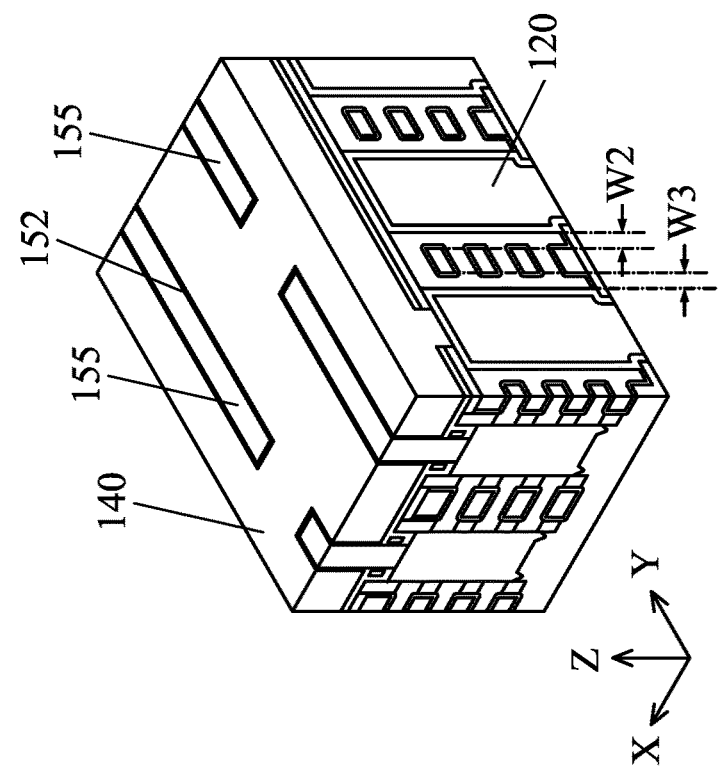
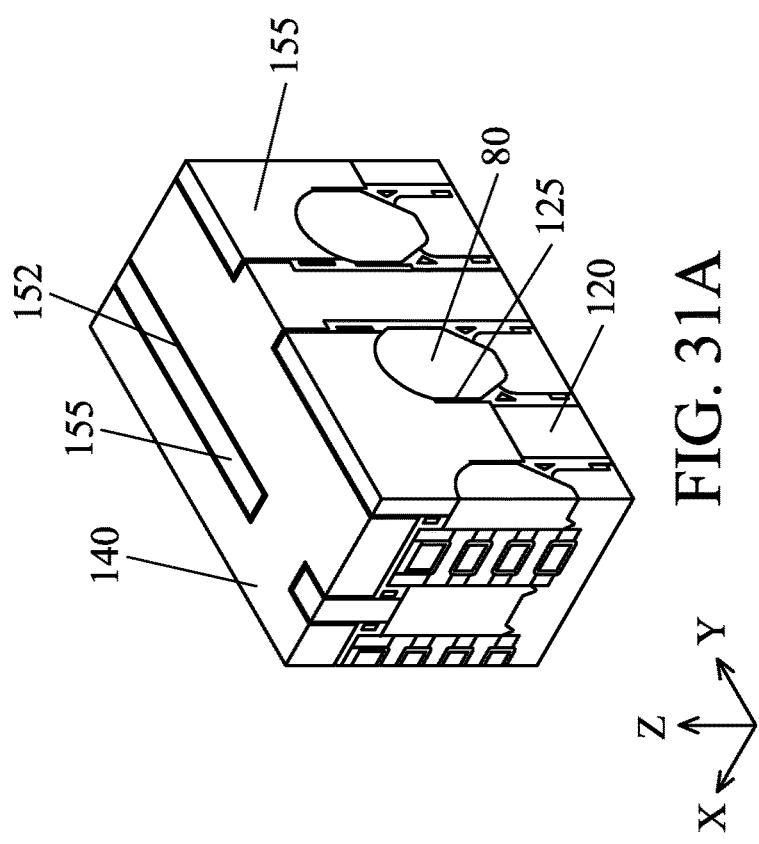
FIG. 31A
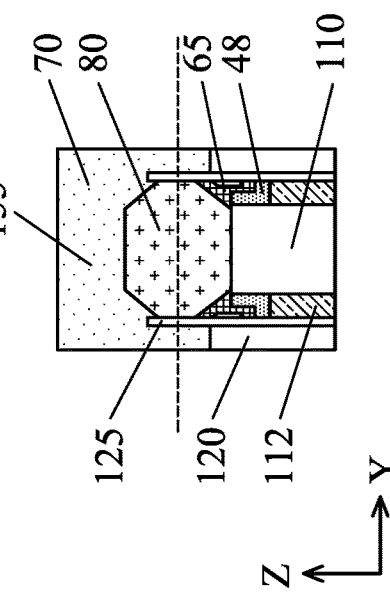
FIG. 31B
FIG. 31C

SEMICONDUCTOR DEVICE INCLUDING SPACERS ON SIDES OF DIELECTRIC STRUCTURE AND MANUFACTURING METHOD THEREOF

RELATED APPLICATIONS

This application claims priority to U.S. Provisional Patent Application No. 63/342,790 filed May 17, 2022, the entire content of which is incorporated herein by reference.

BACKGROUND

As the size of semiconductor devices becomes smaller, a backside of a semiconductor substrate is used for placing conductive patterns coupled to conductive patterns formed on or over the front surface of the substrate by through-silicon-via (TSV) or other connecting patterns. Fabrication processes on or from the backside generally have greater process windows than processes on or from the frontside of the semiconductor wafer.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

FIGS. 21A, 21B, 21C and 21D show schematic views of one of the various stages of a sequential manufacturing operation of a semiconductor device according to an embodiment of the present disclosure.

FIGS. 24A, 24B and 24C show schematic views of one of the various stages of a sequential manufacturing operation of a semiconductor device according to an embodiment of the present disclosure.

FIGS. 28, 29 and 30 show schematic views of the various stages of a sequential manufacturing operation of a semiconductor device according to an embodiment of the present disclosure.

FIGS. 31A, 31B, 31C, 31D and 31E show schematic views of one of the various stages of a sequential manufacturing operation of a semiconductor device according to an embodiment of the present disclosure.

DETAILED DESCRIPTION

Figure 2:
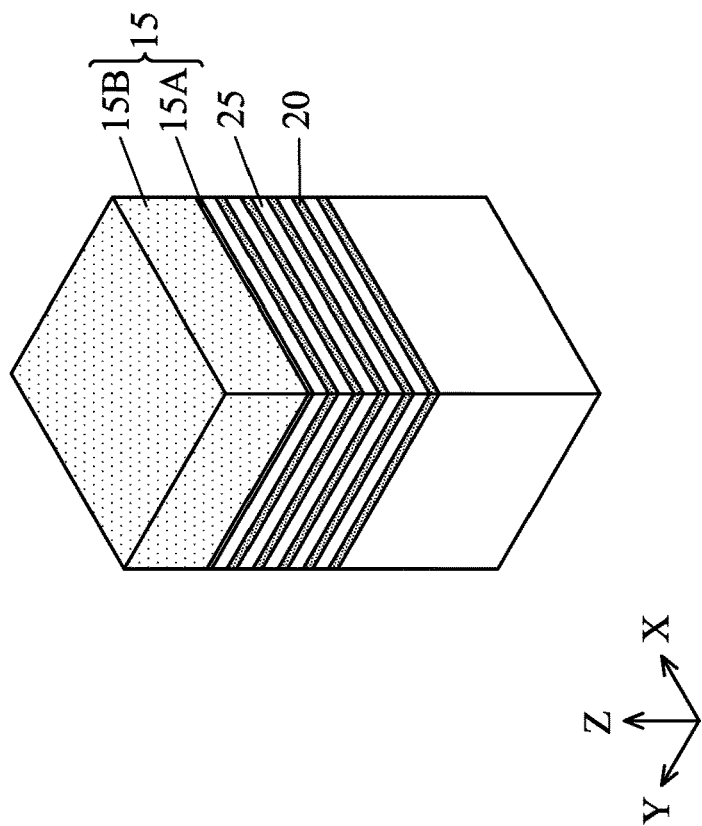
FIGS. 1, 2, 3, 4, 5, 6, 7 and 8 show schematic views of various stages of a sequential manufacturing operation of a semiconductor device according to an embodiment of the present disclosure.

It is to be understood that the following disclosure provides many different embodiments, or examples, for implementing different features of the invention. Specific embodiments or examples of components and arrangements are described below to simplify the present disclosure. These are, of course, merely examples and are not intended to be limiting. For example, dimensions of elements are not limited to the disclosed range or values, but may depend upon process conditions and/or desired properties of the device. Moreover, the formation of a first feature over or on a second feature in the description that follows may include embodiments in which the first and second features are formed in direct contact, and may also include embodiments in which additional features may be formed interposing the first and second features, such that the first and second features may not be in direct contact. Various features may be arbitrarily drawn in different scales for simplicity and clarity. In the accompanying drawings, some layers/features may be omitted for simplification.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The device may be otherwise oriented (rotated 90 degrees or at other orientations) and the spatially relative descriptors used herein may likewise be interpreted accordingly. In addition, the term "made of" may mean either "comprising" or "consisting of." Further, in the following fabrication process, there may be one or more additional operations in/between the described operations, and the order of operations may be changed. In the following embodiments, the term "upper" "over" and/or "above" are defined along directions with an increase in a distance from the front surface and the back surface. Materials, configurations, dimensions, processes and/or operations as explained with respect to one embodiment may be employed in the other embodiments, and the detailed description thereon may be omitted.

In this disclosure, a method of manufacturing a semiconductor device includes a process from a frontside of a semiconductor substrate/wafer and a process from a backside of the substrate/wafer. The circuit over the frontside includes field effect transistors (FETs), such as fin FETs (FinFETs) and gate-all-around FETs (GAA FETs), and other electronic devices and lateral and vertical wiring patterns.

FIGS. 1-31E show a sequential manufacturing process for a semiconductor FET device according to an embodiment of the present disclosure. It is understood that additional operations can be provided before, during, and after processes shown by FIGS. 1-31E, and some of the operations described below can be replaced or eliminated, for additional embodiments of the method. The order of the operations/processes may be interchangeable.

Figure 1:
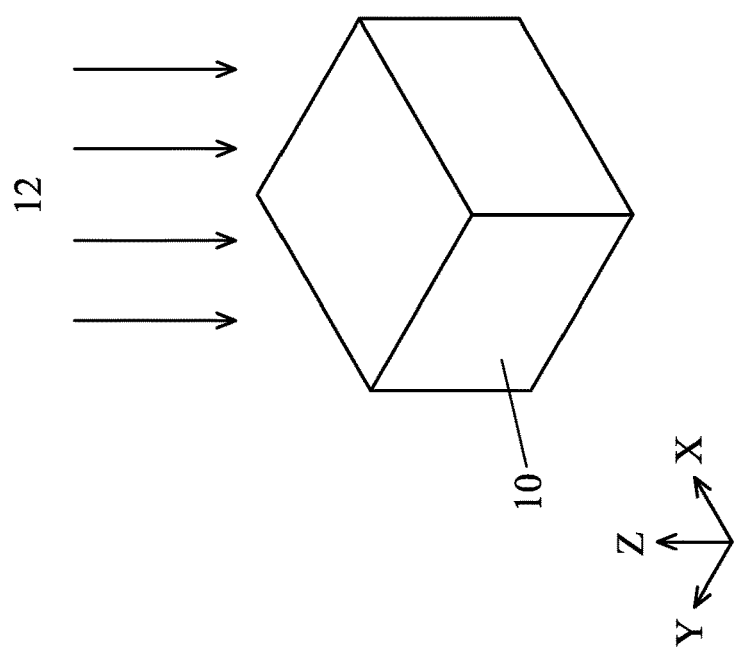

As shown in FIG. 1, impurity ions (dopants) 12 are implanted into a semiconductor substrate (wafer) 10 to form a well region. The ion implantation is performed to prevent a punch-through effect. In some embodiments, the substrate 10 includes a single crystalline semiconductor layer on at least its surface portion. In some embodiments, the substrate 10 is a single crystalline semiconductor material such as, but not limited to Si, Ge, SiGe, GaAs, InSb, GaP, GaSb, InAlAs, InGaAs, GaSbP, GaAsSb and InP. In this embodiment, the substrate 10 is made of Si. The substrate 10 may include in its surface region, one or more buffer layers (not shown). The buffer layers can serve to gradually change the lattice constant from that of the substrate to that of the source/drain regions. The buffer layers may be formed from epitaxially grown single crystalline semiconductor materials such as, but not limited to Si, Ge, GeSn, SiGe, GaAs, InSb, GaP, GaSb, InAlAs, InGaAs, GaSbP, GaAsSb, GaN, GaP, and InP. In a particular embodiment, the substrate 10 comprises silicon germanium (SiGe) buffer layers epitaxially grown on the silicon substrate 10. The germanium concentration of the SiGe buffer layers may increase from 30 atomic % germanium for the bottom-most buffer layer to 70 atomic % germanium for the top-most buffer layer. The substrate 10 may include various regions that have been suitably doped with impurities (e.g., p-type or n-type conductivity). The dopants 12 are, for example, boron ($BF_2$) for an n-type Fin FET and phosphorus for a p-type Fin FET.

Then, as shown in FIG. 2, stacked semiconductor layers are formed over the substrate 10. The stacked semiconductor layers include first semiconductor layers 20 and second semiconductor layers 25. Further, a mask layer 15 is formed over the stacked layers. The first semiconductor layers 20 and the second semiconductor layers 25 are made of materials having different lattice constants, and may include one or more layers of Si, Ge, SiGe, GaAs, InSb, GaP, GaSb, InAlAs, InGaAs, GaSbP, GaAsSb or InP.

In some embodiments, the first semiconductor layers 20 and the second semiconductor layers 25 are made of Si, a Si compound, SiGe, Ge or a Ge compound. In one embodiment, the first semiconductor layers 20 are $Si_{1-x}Ge_x$, where x is more than about 0.3, or Ge (x=1.0) and the second semiconductor layers 25 are Si or $Si_{1-y}Ge_y$, where y is less than about 0.4, and x>y. In this disclosure, an "M compound" or an "M based compound" means the majority of the compound is M. In another embodiment, the second semiconductor layers 25 are $Si_{1-y}Ge_y$, where y is more than about 0.3, or Ge, and the first semiconductor layers 20 are Si or $Si_{1-x}Ge_x$, where x is less than about 0.4, and x<y. In yet other embodiments, the first semiconductor layer 20 is made of $Si_{1-x}Ge_x$, where x is in a range from about 0.3 to about 0.8, and the second semiconductor layer 25 is made of $Si_{1-x}Ge_x$, where x is in a range from about 0.1 to about 0.4. In FIG. 2, five layers of the first semiconductor layer 20 and five layers of the second semiconductor layer 25 are disposed. However, the number of the layers are not limited to five, and may be as small as 1 (each layer) and in some embodiments, 2-10 layers of each of the first and second semiconductor layers are formed. By adjusting the numbers of the stacked layers, a driving current of the GAA FET device can be adjusted.

The first semiconductor layers 20 and the second semiconductor layers 25 are epitaxially formed over the substrate 10. The thickness of the first semiconductor layers 20 may be equal to or greater than that of the second semiconductor layers 25, and is in a range from about 5 nm to about 50 nm in some embodiments, and is in a range from about 10 nm to about 30 nm in other embodiments. The thickness of the second semiconductor layers 25 is in a range from about 5 nm to about 30 nm in some embodiments, and is in a range from about 10 nm to about 20 nm in other embodiments. The thickness of each of the first semiconductor layers 20 may be the same, or may vary. In some embodiments, the bottom first semiconductor layer (the closest layer to the substrate 10) is thicker than the remaining first semiconductor layers. The thickness of the bottom first semiconductor layer is in a range from about 10 nm to about 50 nm in some embodiments, or is in a range from 20 nm to 40 nm in other embodiments.

In some embodiments, as shown in FIG. 2, the mask layer 15 includes a first mask layer 15A and a second mask layer 15B. The first mask layer 15A is a pad oxide layer made of a silicon oxide, which can be formed by a thermal oxidation. The second mask layer 15B is made of a silicon nitride (SiN), which is formed by chemical vapor deposition (CVD), including low pressure CVD (LPCVD) and plasma enhanced CVD (PECVD), physical vapor deposition (PVD), atomic layer deposition (ALD), or other suitable process. The mask layer 15 is patterned into a mask pattern by using patterning operations including photolithography and etching.

Figure 3:
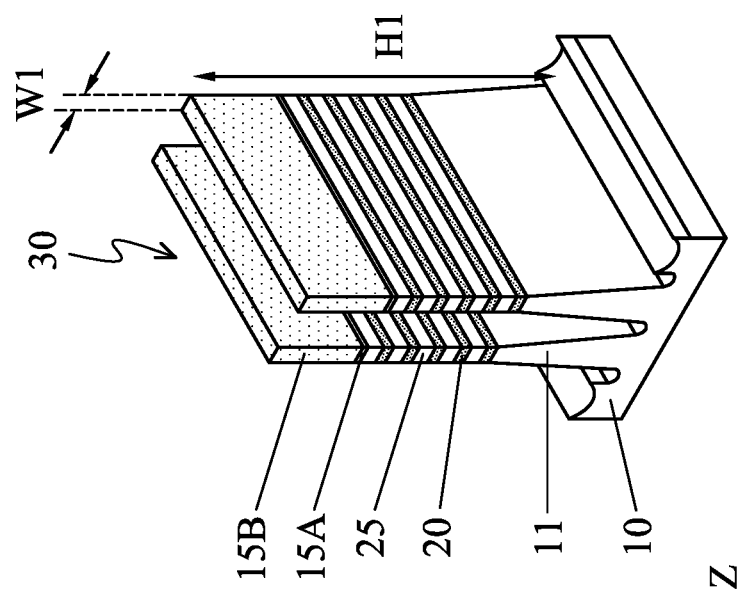

Next, as shown in FIG. 3, the stacked layers of the first and second semiconductor layers 20, 25 are patterned by using the patterned mask layer, thereby the stacked layers are formed into fin structures 30 extending in the X direction. In FIG. 3, two fin structures 30 are arranged in the Y direction. But the number of the fin structures is not limited to, and may be as small as one and three or more. In some embodiments, one or more dummy fin structures are formed on both sides of the fin structures 30 to improve pattern fidelity in the patterning operations.

The fin structures 30 can be patterned by any suitable method. For example, the fin structures may be patterned using one or more photolithography processes, including double-patterning or multi-patterning processes. Generally, double-patterning or multi-patterning processes combine photolithography and self-aligned processes, allowing patterns to be created that have, for example, pitches smaller than what is otherwise obtainable using a single, direct photolithography process. For example, in one embodiment, a sacrificial layer is formed over a substrate and patterned into mandrels using a photolithography process. Spacers are formed alongside the mandrels using a self-aligned process. The mandrels are then removed, and the remaining spacers may then be used to pattern the fin structures. The multi-patterning processes combining photolithography and self-aligned processes generally result in forming a pair of fin structures.

As shown in FIG. 3, the fin structures 30 have upper portions constituted by the stacked semiconductor layers 20, 25 and well portions 11. The width W1 of the upper portion of the fin structure along the Y direction is in a range from about 5 nm to about 50 nm in some embodiments, and is in a range from about 10 nm to about 30 nm in other embodiments. The height H1 along the Z direction of the fin structure is in a range from about 100 nm to about 200 nm in some embodiments.

After the fin structure is formed, an insulating material layer 41 including one or more layers of insulating material is formed over the substrate so that the fin structures are fully embedded in the insulating layer 41. The insulating material for the insulating layer 41 may include silicon oxide, silicon nitride, silicon oxynitride (SiON), SiOCN, SiCN, fluorine-doped silicate glass (FSG), or a low-k dielectric material, formed by LPCVD (low pressure chemical vapor deposition), plasma-CVD or flowable CVD. An anneal operation may be performed after the formation of the insulating layer 41. Then, a planarization operation, such as a chemical mechanical polishing (CMP) method and/or an etch-back method, is performed such that the upper surface of the uppermost second semiconductor layer 25 is exposed from the insulating material layer 41 as shown in FIG. 4.

Figure 4:
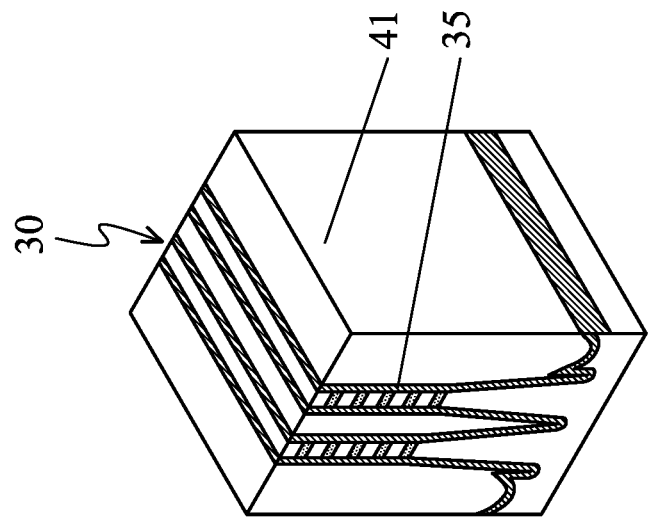

In some embodiments, a first liner layer 35 is formed over the structure of FIG. 3 before forming the insulating material layer 41, as shown FIG. 4. The first liner layer 35 is made of SiN or a silicon nitride-based material (e.g., SiON, SiCN or SiOCN).

Figure 5:
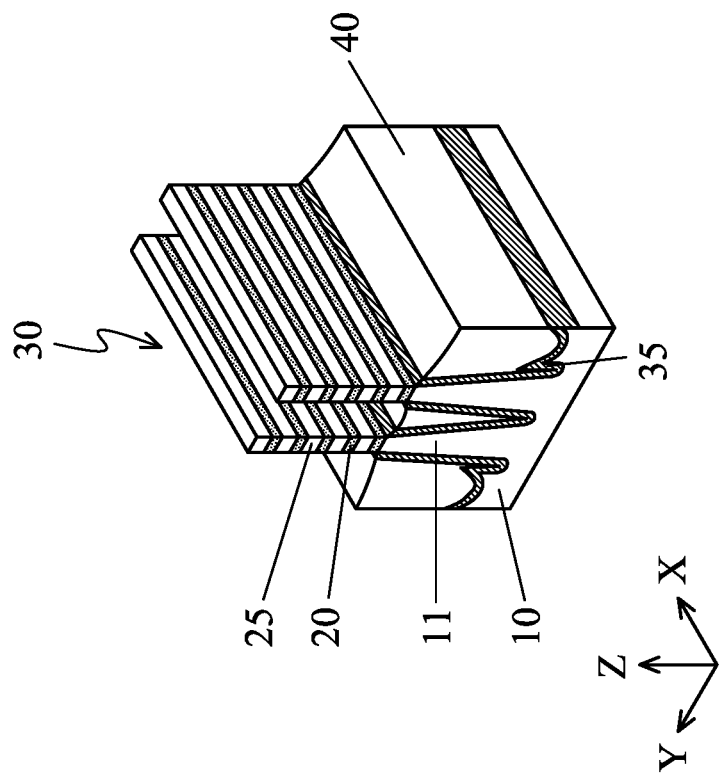

Then, as shown in FIG. 5, the insulating material layer 41 is recessed to form an isolation insulating layer 40 so that the upper portions of the fin structures 30 are exposed. With this operation, the fin structures 30 are electrically separated from each other by the isolation insulating layer 40, which is also called a shallow trench isolation (STI).

In the embodiment shown in FIG. 5, the insulating material layer 41 is recessed until the bottommost first semiconductor layer 20 is exposed. In other embodiments, the upper portion of the well layer 11 is also partially exposed. The first semiconductor layers 20 are sacrificial layers which are subsequently partially removed, and the second semiconductor layers 25 are subsequently formed into channel layers of a GAA FET.

Figure 6:
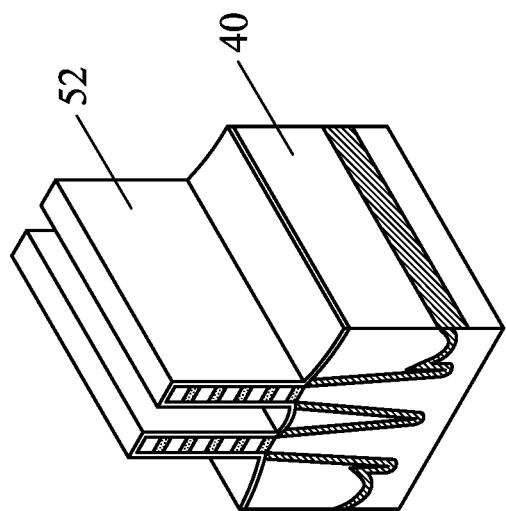

After the isolation insulating layer 40 is formed, a sacrificial gate dielectric layer 52 is formed, as shown in FIG. 6. The sacrificial gate dielectric layer 52 includes one or more layers of insulating material, such as a silicon oxide-based material. In one embodiment, silicon oxide formed by CVD is used. The thickness of the sacrificial gate dielectric layer 52 is in a range from about 1 nm to about 5 nm in some embodiments.

Figure 7:
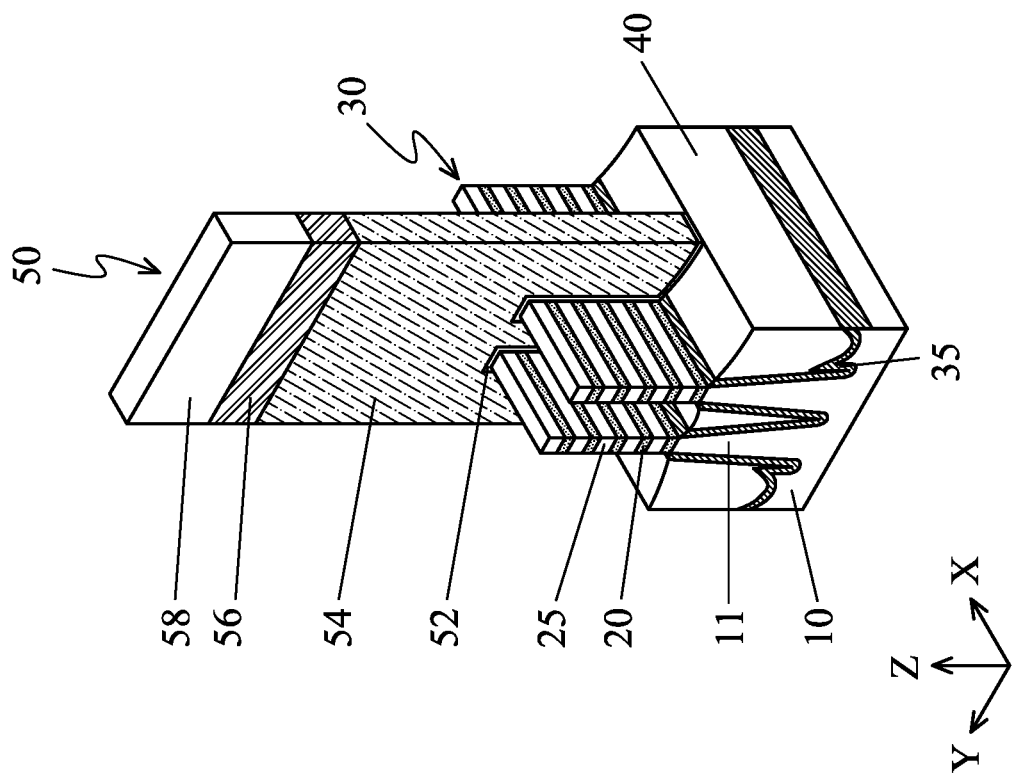

FIG. 7 illustrates a structure after a sacrificial gate structure 50 is formed over the exposed fin structures 30. The sacrificial gate structure includes a sacrificial gate electrode 54 and the sacrificial gate dielectric layer 52. The sacrificial gate structure 50 is formed over a portion of the fin structure which is to be a channel region. The sacrificial gate structure defines the channel region of the GAA FET.

The sacrificial gate structure 50 is formed by first blanket depositing the sacrificial gate dielectric layer 52 over the fin structures. A sacrificial gate electrode layer is then blanket deposited on the sacrificial gate dielectric layer and over the fin structures, such that the fin structures are fully embedded in the sacrificial gate electrode layer. The sacrificial gate electrode layer includes silicon, such as polycrystalline silicon or amorphous silicon. The thickness of the sacrificial gate electrode layer is in a range from about 100 nm to about 200 nm in some embodiments. In some embodiments, the sacrificial gate electrode layer is subjected to a planarization operation. The sacrificial gate dielectric layer and the sacrificial gate electrode layer are deposited using CVD, including LPCVD and PECVD, PVD, ALD, or other suitable process. Subsequently, a mask layer is formed over the sacrificial gate electrode layer. The mask layer includes a pad SiN layer 56 and a silicon oxide mask layer 58.

Next, a patterning operation is performed on the mask layer and sacrificial gate electrode layer is patterned into the sacrificial gate structure 50, as shown in FIG. 7. The sacrificial gate structure includes the sacrificial gate dielectric layer 52, the sacrificial gate electrode layer 54 (e.g., poly silicon), the pad SiN layer 56 and the silicon oxide mask layer 58. By patterning the sacrificial gate structure, the stacked layers of the first and second semiconductor layers are partially exposed on opposite sides of the sacrificial gate structure, thereby defining source/drain (S/D) regions, as shown in FIG. 7. In this disclosure, a source (region) and a drain (region) are interchangeably used, and the structures thereof are substantially the same. In FIG. 7, one sacrificial gate structure is formed, but the number of the sacrificial gate structures is not limited to one. Two or more sacrificial gate structures are arranged in the X direction in some embodiments. In certain embodiments, one or more dummy sacrificial gate structures are formed on both sides of the sacrificial gate structures to improve pattern fidelity.

Figure 8:
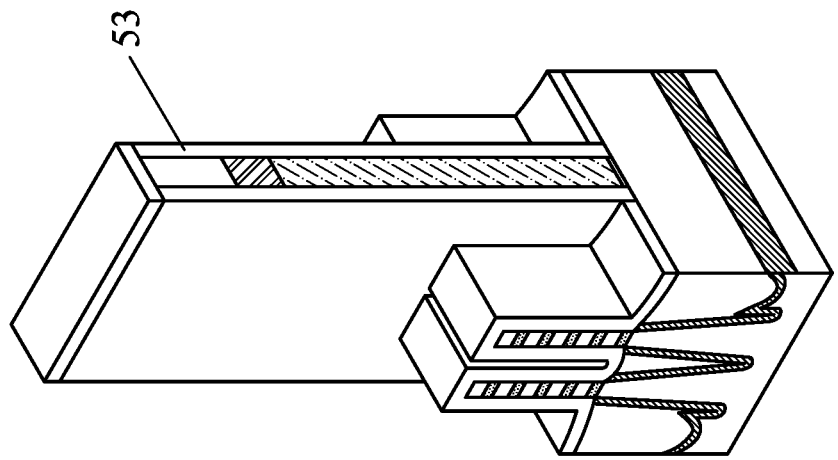

After the sacrificial gate structure is formed, a blanket layer 53 of an insulating material for sidewall spacers 55 is conformally formed by using CVD or other suitable methods, as shown in FIG. 8. The blanket layer 53 is deposited in a conformal manner so that it has substantially equal thicknesses on vertical surfaces, such as the sidewalls, horizontal surfaces, and the top of the sacrificial gate structure. In some embodiments, the blanket layer 53 is deposited to a thickness in a range from about 2 nm to about 10 nm. In one embodiment, the insulating material of the blanket layer 53 is a silicon nitride-based material, such as SiN, SiON, SiOCN or SiCN and combinations thereof.

Figure 9B:
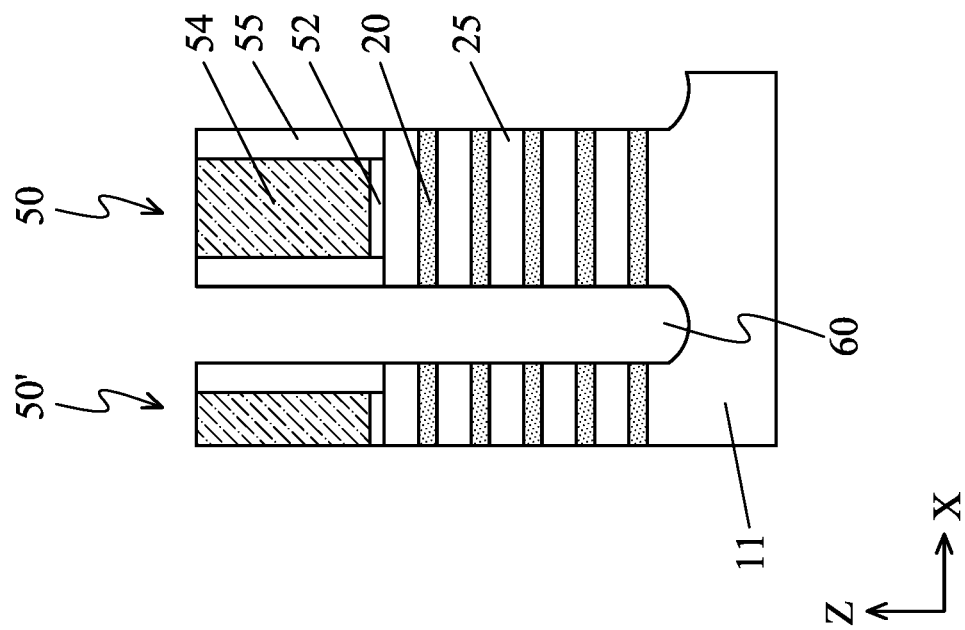
FIGS. 9A and 9B show schematic views of one of the various stages of a sequential manufacturing operation of a semiconductor device according to an embodiment of the present disclosure.
Figure 9A:
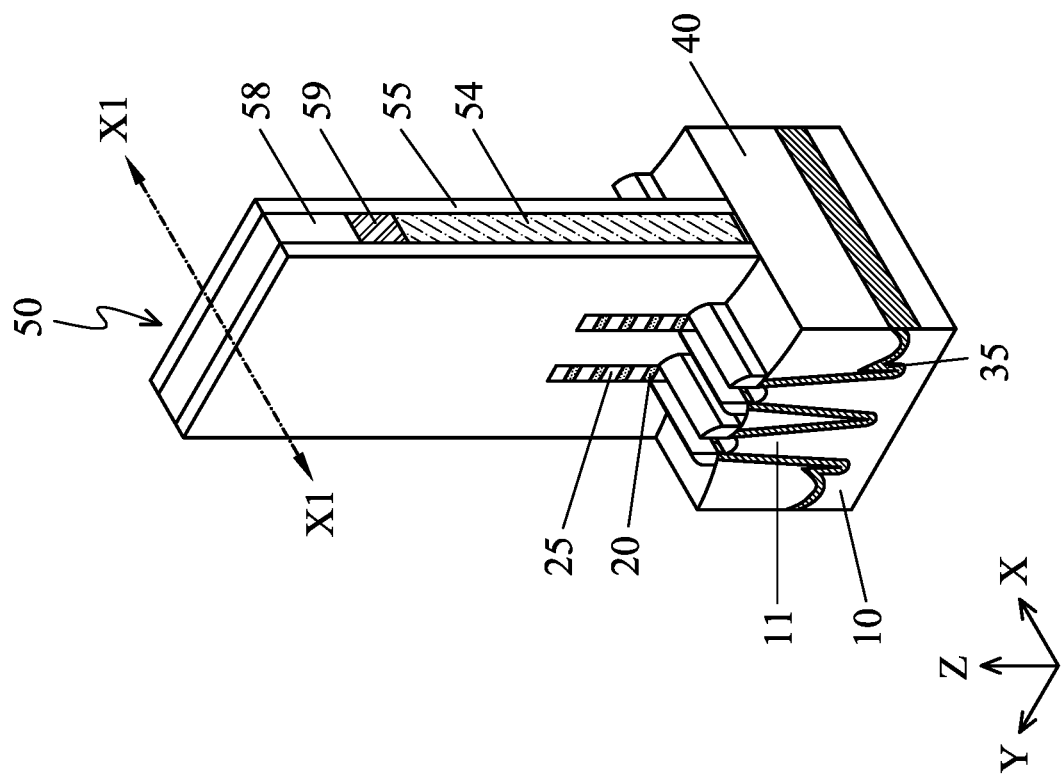

Further, as shown in FIGS. 9A and 9B, sidewall spacers 55 are formed on opposite sidewalls of the sacrificial gate structures, and subsequently, the fin structures of the S/D regions are recessed down below the upper surface of the isolation insulating layer 40. FIG. 9B is a cross sectional view corresponding to line X1-X1 of FIG. 9A. In FIG. 9B, the cross section of the bottom parts of one sacrificial gate structure 50 and an adjacent sacrificial gate structure 50' are illustrated.

After the blanket layer 53 is formed, anisotropic etching is performed on the blanket layer 53 using, for example, reactive ion etching (RIE). During the anisotropic etching process, most of the insulating material is removed from horizontal surfaces, leaving the dielectric spacer layer on the vertical surfaces such as the sidewalls of the sacrificial gate structures and the sidewalls of the exposed fin structures. The mask layer 58 may be exposed from the sidewall spacers. In some embodiments, isotropic etching may be subsequently performed to remove the insulating material from the upper portions of the S/D region of the exposed fin structures 30.

Subsequently, the fin structures of the S/D regions are recessed down below the upper surface of the isolation insulating layer 40, by using dry etching and/or wet etching. As shown in FIG. 9A, the sidewall spacers 55 formed on the S/D regions of the exposed fin structures partially remain. In other embodiments, however, the sidewall spacers 55 formed on the S/D regions of the exposed fin structures are fully removed. At this stage, end portions of the stacked layer of the first and second semiconductor layers 20, 25 under the sacrificial gate structure have substantially flat faces which are flush with the sidewall spacers 55, as shown in FIG. 9B. In some embodiments, the end portions of the stacked layer of the first and second semiconductor layers 20, 25 are slightly horizontally etched.

Figure 10B:
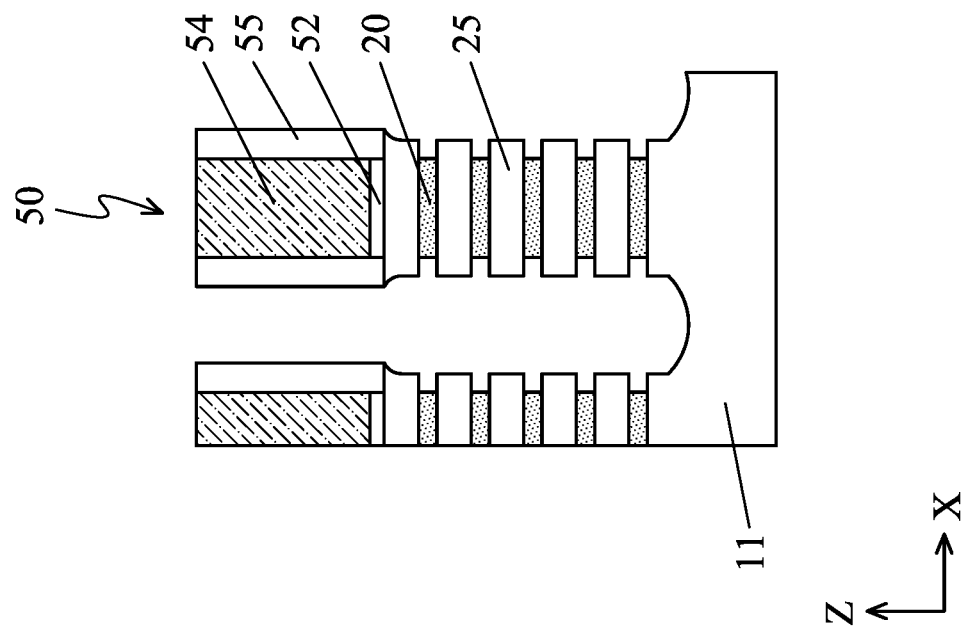
FIGS. 10A and 10B show schematic views of one of the various stages of a sequential manufacturing operation of a semiconductor device according to an embodiment of the present disclosure.
Figure 10A:
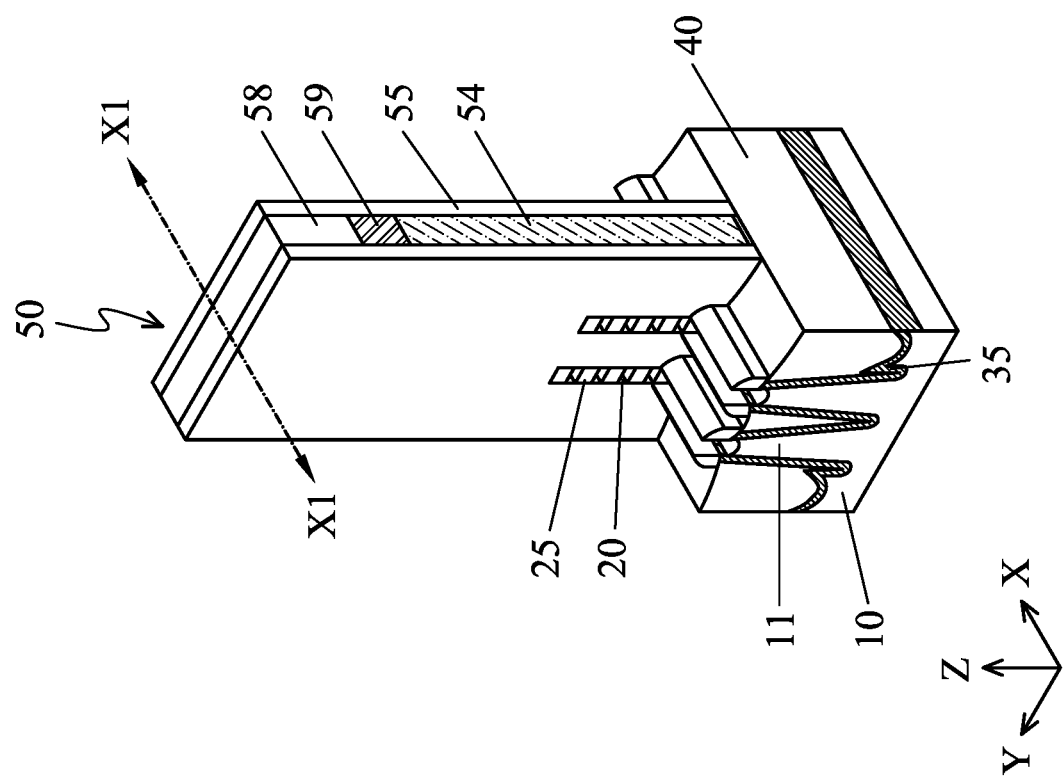

Subsequently, as shown in FIGS. 10A and 10B, the first semiconductor layers 20 are horizontally recessed (etched) so that edges of the first semiconductor layers 20 are located substantially below a side face of the sacrificial gate electrode layer 54. In some embodiments, as shown in FIG. 10B, end portions (edges) of the first semiconductor layers 20 under the sacrificial gate structure are substantially aligned with the side faces of the sacrificial gate electrode layer 54. Here, "being substantially aligned" means the difference in the relative position is less than about 1 nm. In some embodiments, the ends of the first semiconductor layers 20 are curved convex toward inside of the first semiconductor layers 20. In some embodiments, during the recess etching of the first semiconductor layers 20 and/or the recess etching of the first and second semiconductor layers, end portions of the second semiconductor layers 25 are also horizontally etched. The recessed amount of the first semiconductor layers 20 is greater than the recessed amount of the second semiconductor layers 25.

Figure 11:
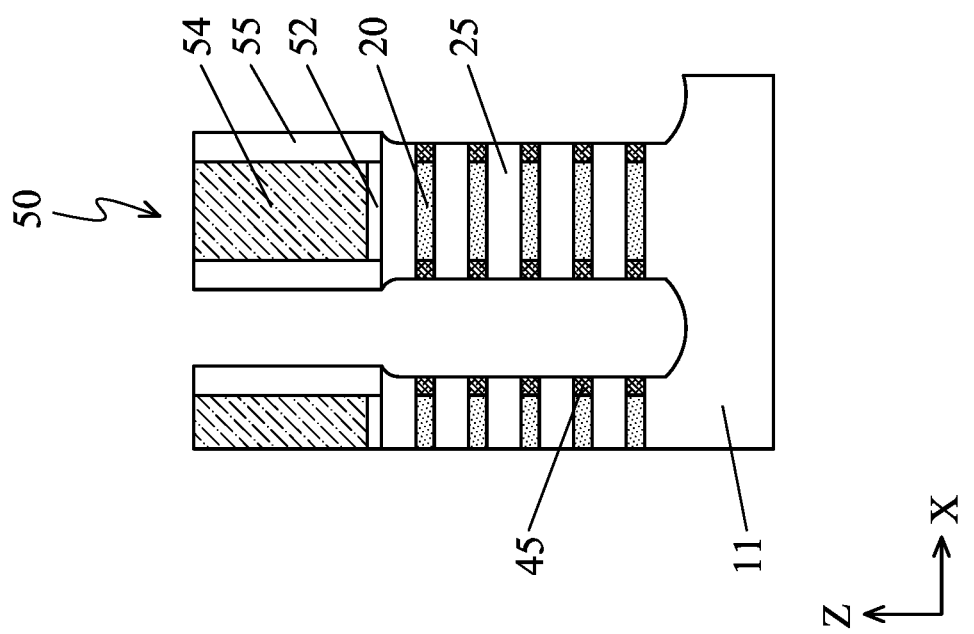
FIGS. 11, 12, 13 and 14 show schematic views of the various stages of a sequential manufacturing operation of a semiconductor device according to an embodiment of the present disclosure.
Figure 12:
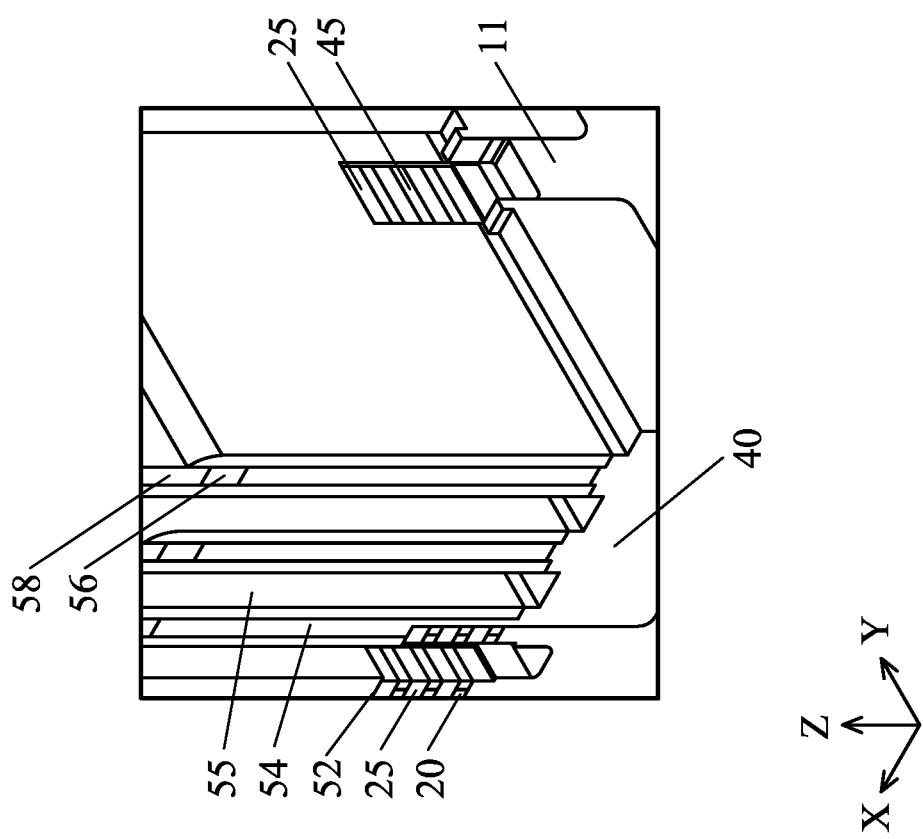

After the first semiconductor layers 20 are horizontally recessed, one or more dielectric layers are conformally formed on the end surfaces of the first and second semiconductor layers 20, 25, on the fin structure 11 and over the sacrificial gate structures 50. Then, anisotropic etching is performed to form inner spacers 45 on the end faces of the first semiconductor layers 20 as shown in FIG. 11. The inner spacers 45 are made of one or more of silicon nitride and silicon oxide, SiON, SiOC, SiCN or SiOCN, or any other suitable dielectric material. FIG. 12 is a perspective view corresponding to the process stage of FIG. 11.

Figure 13:
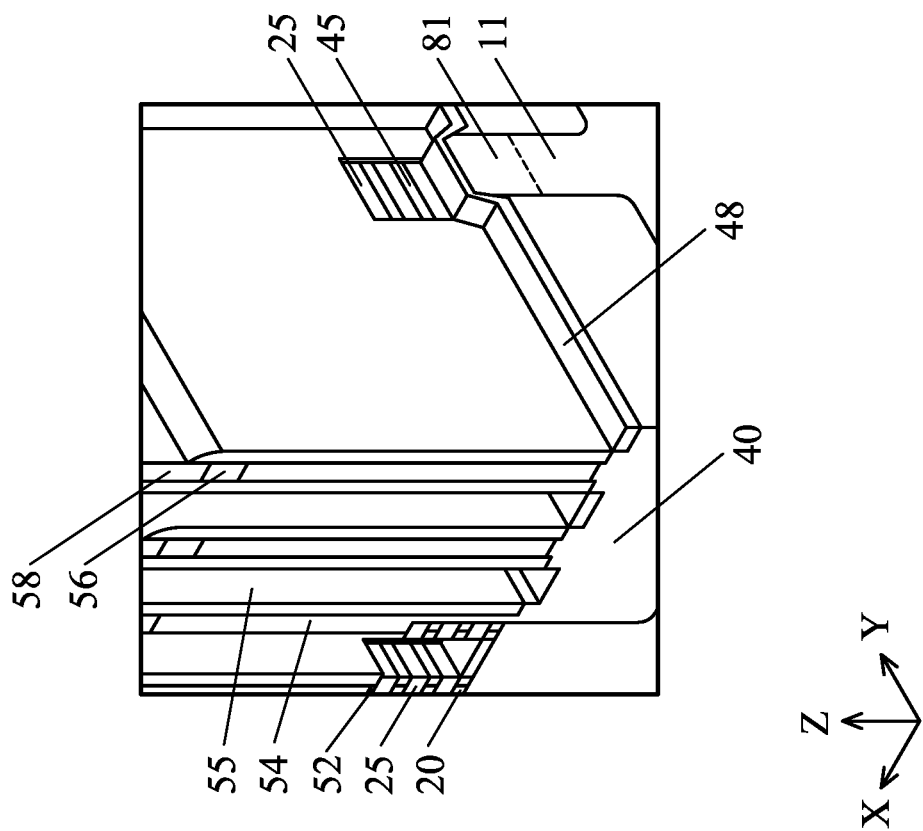

After the inner spacers 45 are formed, a first epitaxial layer 81 is formed over the recessed fin structure 11, and then a dielectric layer 48 is formed over the first epitaxial layer 81 and the isolation insulating layer 40, as shown in FIG. 13.

In some embodiments, the first epitaxial layer 81 is a non-doped epitaxial semiconductor layer, such as Si or SiGe. In some embodiments, the dielectric layer 48 includes one or more of silicon nitride and silicon oxide, SiON, SiOC, SiCN and SiOCN, or any other suitable dielectric material, which is the same as or different from the dielectric material of the isolation insulating layer 40, sidewall spacer 55 and/or the inner spacers 45.

Figure 14:
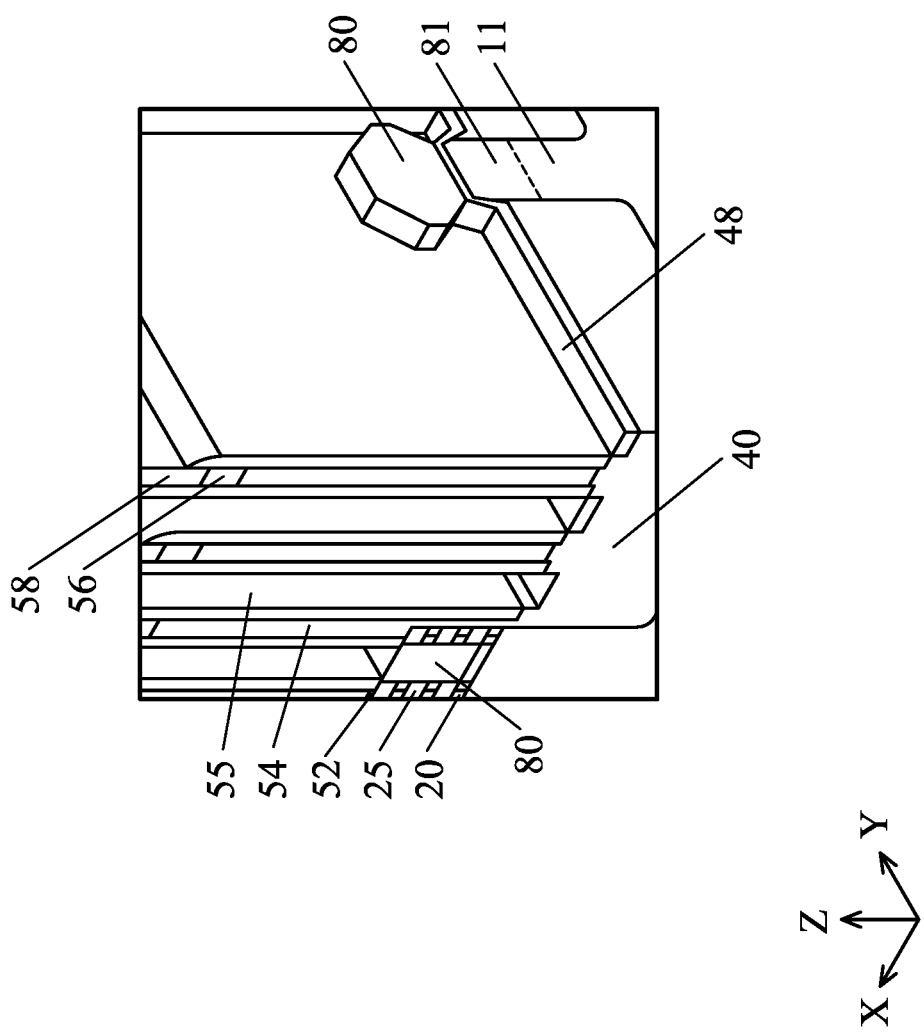
Figure 15:
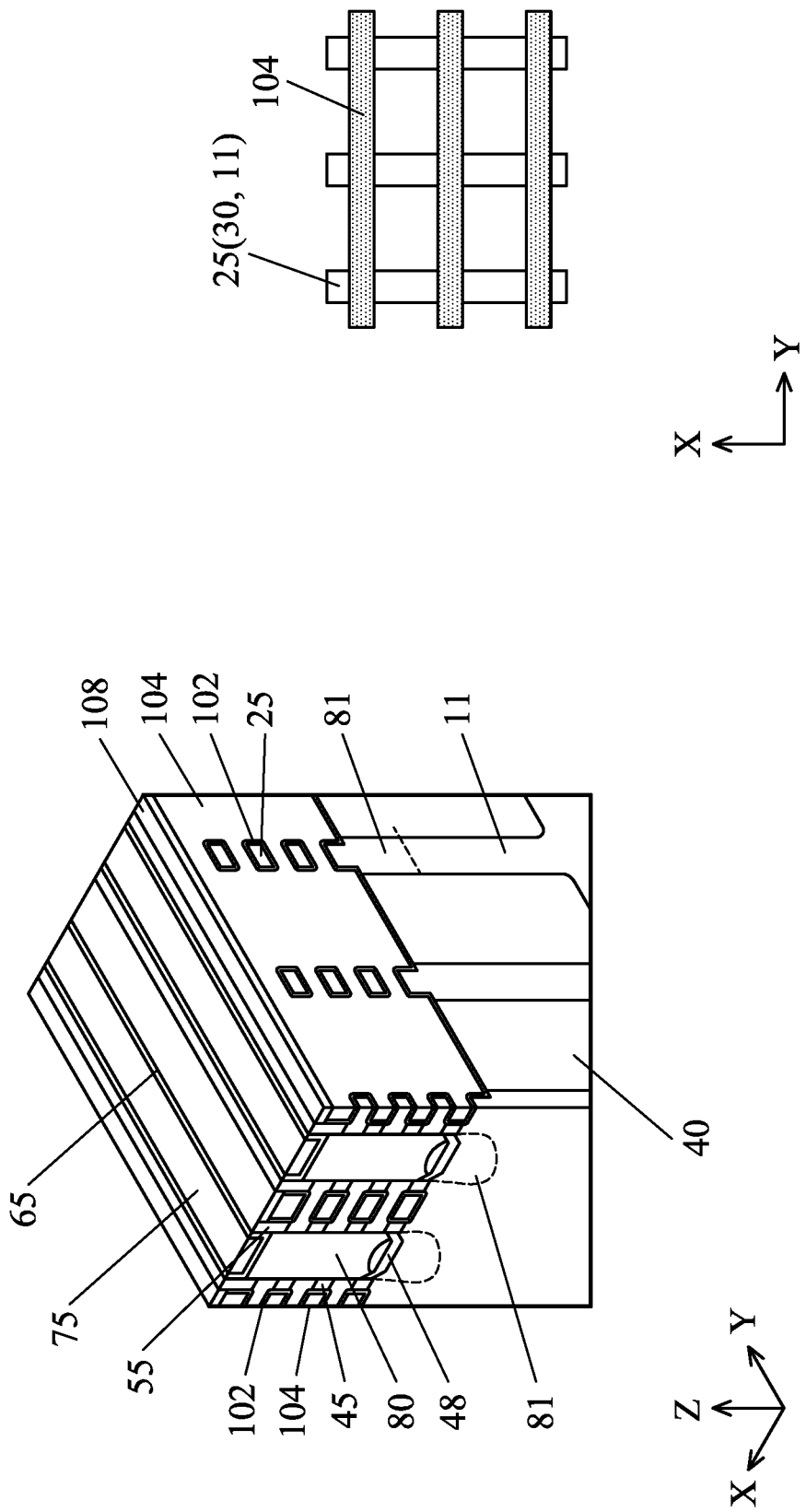
FIGS. 15A and 15B show schematic views of one of the various stages of a sequential manufacturing operation of a semiconductor device according to an embodiment of the present disclosure.

Next, as shown in FIG. 14, a second epitaxial layer (source/drain epitaxial layer) 80 is formed on the end faces of the second semiconductor layers 25. The source/drain epitaxial layer includes one or more layers of SiP, SiAs, SiCP, SiPAs and/or SiC for an n-type FET, and SiGe, GeSn and/or SiGeSn for a p-type FET. For the p-type FET, the source/drain epitaxial layer is doped with B (boron) in some embodiments. In some embodiments, the source/drain epitaxial layer includes multiple layers. The source/drain epitaxial layers are formed by an epitaxial growth method using CVD, ALD or molecular beam epitaxy (MBE).

In some embodiments, the source/drain epitaxial layer of an n-type FET includes a first epitaxial layer grown from the end faces of the second semiconductor layer 25, a second epitaxial layer formed on the first epitaxial layer and a third epitaxial layer formed on the second epitaxial layer. In some embodiments, the first epitaxial layer is made of SiP, SiAs or SiAs:P or a combination thereof. In some embodiments, the P concentration of the first epitaxial layer is in a range from about $0.5 \times 10^{19}$ atoms/cm$^3$ to about $5 \times 10^{20}$ atoms/cm$^3$, and is in a range from about $0.8 \times 10^{19}$ atoms/cm$^3$ to about $2 \times 10^{20}$ atoms/cm$^3$ in other embodiments. In some embodiments, the second epitaxial layer is made of SiP. In some embodiments, the P concentration of the second epitaxial layer is higher than that of the first SiP epitaxial layer, and is in a range from about $1 \times 10^{21}$ atoms/cm$^3$ to about $5 \times 10^{21}$ atoms/cm$^3$, and is in a range from about $2 \times 10^{21}$ atoms/cm$^3$ to about $4 \times 10^{21}$ atoms/cm$^3$ in other embodiments. In some embodiments, the third epitaxial layer is made of SiGeP. In some embodiments, the P concentration of the third epitaxial layer is equal to or lower than that of the second SiP epitaxial layer and higher than that of the first SiP epitaxial layer, and is in a range from about $0.5 \times 10^{21}$ atoms/cm$^3$ to about $4 \times 10^{21}$ atoms/cm$^3$, and is in a range from about $1 \times 10^{21}$ atoms/cm$^3$ to about $3 \times 10^{21}$ atoms/cm$^3$ in other embodiments. In some embodiments, the Ge concentration of the third epitaxial layer is in a range from about 0.5 atomic % to 10 atomic %, and is in a range from about 1 atomic % to about 5 atomic % in other embodiments.

In some embodiments, the source/drain epitaxial layer of a p-type FET includes a first epitaxial layer, a second epitaxial layer and a third epitaxial layer, similar to the n-type FET as above. In some embodiments, the first epitaxial layer is made of SiGe doped with B. In some embodiments, the Ge content is in a range from about 15 atomic % to about 30 atomic %. In some embodiments, the B concentration of the first epitaxial layer is in a range from about $1 \times 10^{19}$ atoms/cm$^3$ to about $1 \times 10^{21}$ atoms/cm$^3$, and is in a range from about $5 \times 10^{19}$ atoms/cm$^3$ to about $5 \times 10^{20}$ atoms/cm$^3$ in other embodiments. In some embodiments, the second epitaxial layer is made of SiGe doped with B. In some embodiments, the Ge content of the second epitaxial layer is in a range from about 20 atomic % to about 35 atomic % in some embodiments. In some embodiments, the B concentration of the second epitaxial layer is equal to or higher than the largest B concentration of the first epitaxial layer, and is in a range from about $0.5 \times 10^{20}$ atoms/cm$^3$ to about $1 \times 10^{21}$ atoms/cm$^3$, and is in a range from about $1 \times 10^{20}$ atoms/cm$^3$ to about $5 \times 10^{20}$ atoms/cm$^3$ in other embodiments. In some embodiments, the third epitaxial layer is made of SiGe doped with B. In some embodiments, the Ge content is in a range from 25 atomic % to about 60 atomic %. In some embodiments, the average Ge content of the third epitaxial layer is greater than the Ge content of the second epitaxial layer. In some embodiments, the B concentration of the third epitaxial layer is in a range from about $5\times10^{19}$ atoms/cm$^3$ to about $5\times10^{21}$ atoms/cm$^3$, and is in a range from about $1\times10^{20}$ atoms/cm$^3$ to about $3\times10^{21}$ atoms/cm$^3$ in other embodiments.

As shown in FIG. 14, the source/drain epitaxial layer 80 is in contact with the dielectric layer 48 and the inner spacers 45.

FIGS. 15A and 15B show structures after a metal gate structure is formed. FIG. 15A is a perspective view and FIG. 15B is a layout or a plan view showing only fin structures (active regions) and metal gate electrode. After the source/drain epitaxial layer 80 is formed, a first etch stop layer (ESL) 65 is formed over the sacrificial gate structure 50 and the S/D epitaxial layer 80. The first ESL 65 is made of silicon nitride, SiON or any other suitable dielectric material and has a thickness in a range from about 1 nm to about 20 nm in some embodiments. Further, a first interlayer dielectric (ILD) layer 70 is formed over the ESL 65. In some embodiments, the first ILD layer 70 is made of silicon oxide, SiON, SiOCN, SiOC, SiCN or any other suitable dielectric material, different from the first ESL 65. After the first ILD layer 70 is formed, one or more planarization operations, such as chemical mechanical polishing (CMP), are performed to expose the sacrificial gate electrode 54.

Then, the sacrificial gate electrode 54 and sacrificial gate dielectric layer 52 are removed. The first ILD layer 70 protects the source/drain epitaxial layer 80 during the removal of the sacrificial gate structures. The sacrificial gate structures can be removed using plasma dry etching and/or wet etching. When the sacrificial gate electrode 54 is polysilicon, a wet etchant such as a TMAH solution can be used to selectively remove the sacrificial gate electrode 54. The sacrificial gate dielectric layer 52 is thereafter removed using plasma dry etching and/or wet etching.

After the sacrificial gate structures are removed, the first semiconductor layers 20 are removed, thereby forming wires or sheets (channel regions) of the second semiconductor layers 25. The first semiconductor layers 20 can be removed or etched using an etchant that can selectively etch the first semiconductor layers 20 against the second semiconductor layers 25. Since the inner spacers 45 are formed, the etching of the first semiconductor layers 20 stops at the inner spacers 45.

After the semiconductor wires or sheets (channel regions) of the second semiconductor layers 25 are released, a gate dielectric layer 102 is formed around each channel regions, and further, a gate electrode layer 104 is formed on the gate dielectric layer 102, as shown in FIG. 15A. In some embodiments, the structure and/or material of the gate electrode for the n-type GAA FET are different from the structure and/or material of the gate electrode for the p-type GAA FET.

In certain embodiments, the gate dielectric layer 102 includes one or more layers of a dielectric material, such as silicon oxide, silicon nitride, or high-k dielectric material, other suitable dielectric material, and/or combinations thereof. Examples of high-k dielectric material include HfO$_2$, HfSiO, HfSiON, HfTaO, HfTiO, HfZrO, zirconium oxide, aluminum oxide, titanium oxide, hafnium dioxide-alumina (HfO$_2$—Al$_2$O$_3$) alloy, other suitable high-k dielectric materials, and/or combinations thereof. In some embodiments, the gate dielectric layer 102 includes an interfacial layer (not shown) formed between the channel layers and the dielectric material. The gate dielectric layer 102 may be formed by CVD, ALD or any suitable method. In one embodiment, the gate dielectric layer 102 is formed using a highly conformal deposition process such as ALD in order to ensure the formation of a gate dielectric layer having a uniform thickness around each channel layers. The thickness of the gate dielectric layer 102 is in a range from about 1 nm to about 6 nm in one embodiment.

The gate electrode layer 104 is formed on the gate dielectric layer 102 to surround each channel layer. The gate electrode 104 includes one or more layers of conductive material, such as polysilicon, aluminum, copper, titanium, tantalum, tungsten, cobalt, molybdenum, tantalum nitride, nickel silicide, cobalt silicide, TiN, WN, TiAl, TiAlN, TaCN, TaC, TaSiN, metal alloys, other suitable materials, and/or combinations thereof.

The gate electrode layer 104 may be formed by CVD, ALD, electro-plating, or other suitable method. The gate dielectric layer and the gate electrode layer are then planarized by using, for example, CMP, until the top surface of the first ILD layer 70 is revealed. In some embodiments, after the planarization operation, the gate electrode layer 104 is recessed and a cap insulating layer (not shown) is formed over the recessed gate electrode 104. The cap insulating layer includes one or more layers of a silicon nitride-based material, such as silicon nitride. The cap insulating layer can be formed by depositing an insulating material followed by a planarization operation.

In certain embodiments of the present disclosure, one or more work function adjustment layers (not shown) are interposed between the gate dielectric layer 102 and the gate electrode 104. The work function adjustment layers are made of a conductive material such as a single layer of TiN, TaN, TaAlC, TiC, TaC, Co, Al, TiAl, HfTi, TiSi, TaSi or TiAlC, or a multilayer of two or more of these materials. For the n-channel FET, one or more of TaN, TaAlC, TiN, TiC, Co, TiAl, HfTi, TiSi and TaSi is used as the work function adjustment layer, and for the p-channel FET, one or more of TiAlC, Al, TiAl, TaN, TaAlC, TiN, TiC and Co is used as the work function adjustment layer. The work function adjustment layer may be formed by ALD, PVD, CVD, e-beam evaporation, or other suitable process. Further, the work function adjustment layer may be formed separately for the n-channel FET and the p-channel FET which may use different metal layers.

Figure 16:
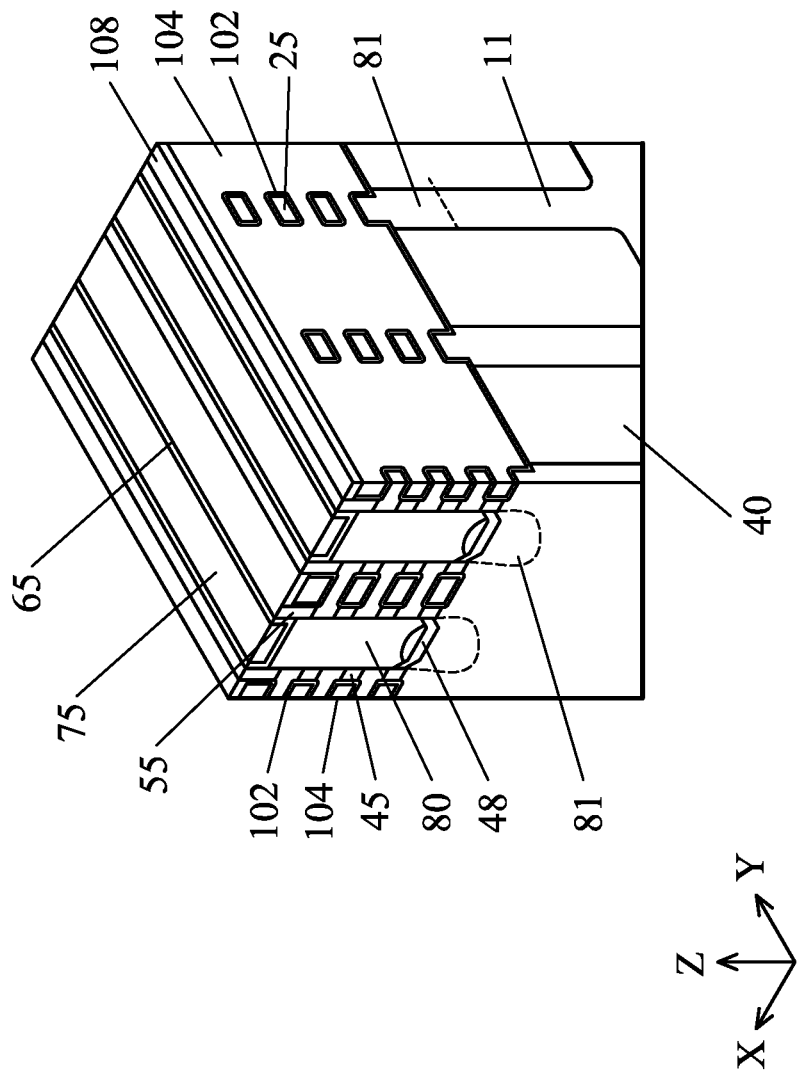
FIGS. 16 and 17 show schematic views of the various stages of a sequential manufacturing operation of a semiconductor device according to an embodiment of the present disclosure.

Further, as shown in FIG. 16, the metal gate electrode layer 104 is recessed and a gate cap metal layer 108 is formed over the recessed metal gate electrode layer 104. The gate cap metal layer 108 is made of one or more of W, Ru, Co, Mo, Ti or an alloy thereof (TiN etc.), or any other suitable conductive material. In some embodiments, the thickness of the gate cap metal layer 108 is in a range from about 3 nm to about 15 nm.

Figure 17:
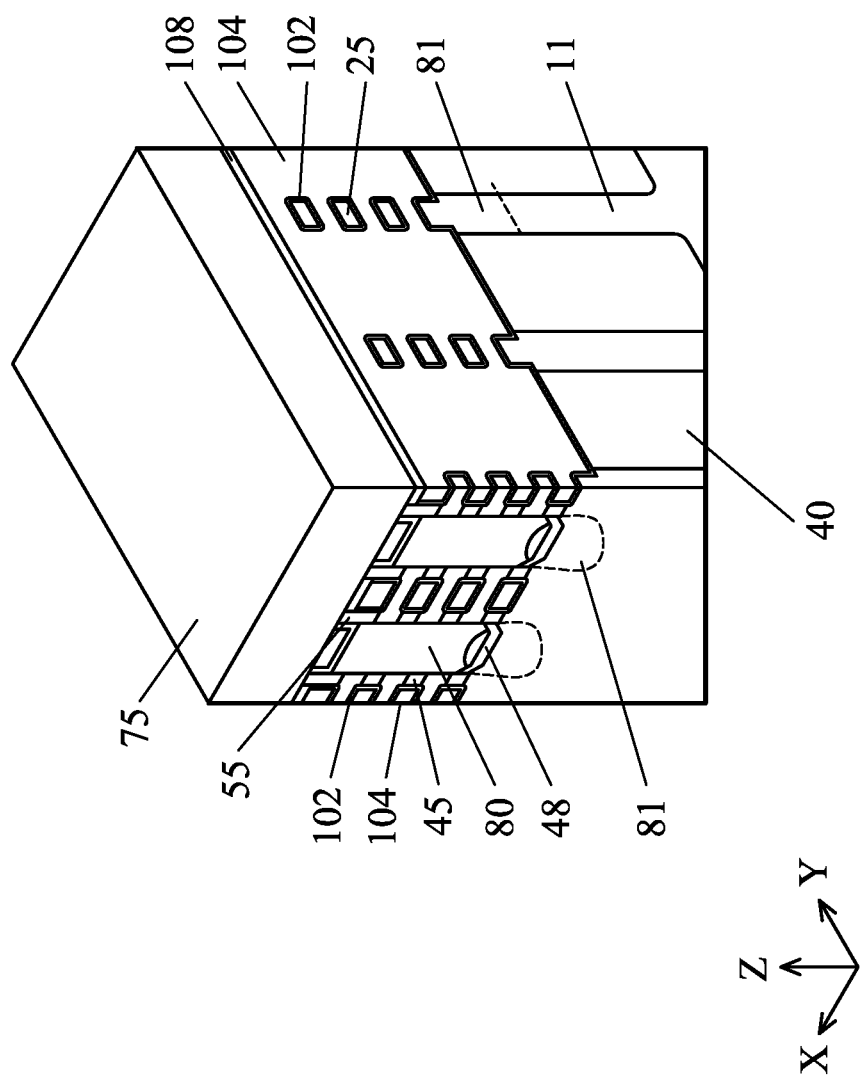

Then, a front hard mask layer 75 is formed over the metal gate structures with the gate cap metal layer 108 and the ILD layer 70 with the first ESL 65, as shown in FIG. 17. In some embodiments, the front hard mask layer 75 is made of silicon nitride, SiON, SiOCN, SiOC, SiCN or any other suitable dielectric material.

Figure 18B:
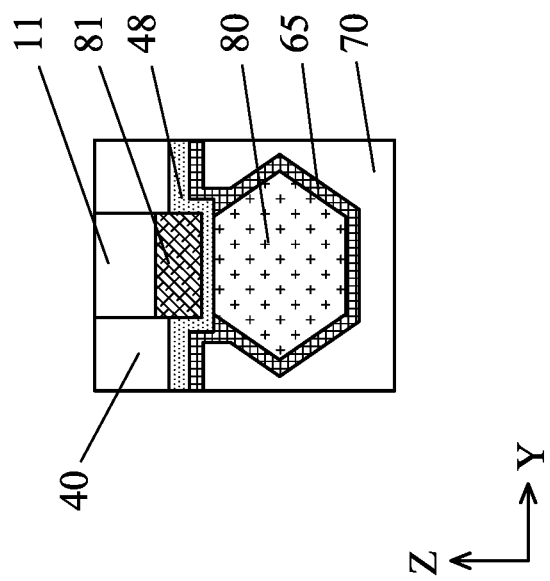
FIGS. 18A and 18B show schematic views of one of the various stages of a sequential manufacturing operation of a semiconductor device according to an embodiment of the present disclosure.
Figure 18A:
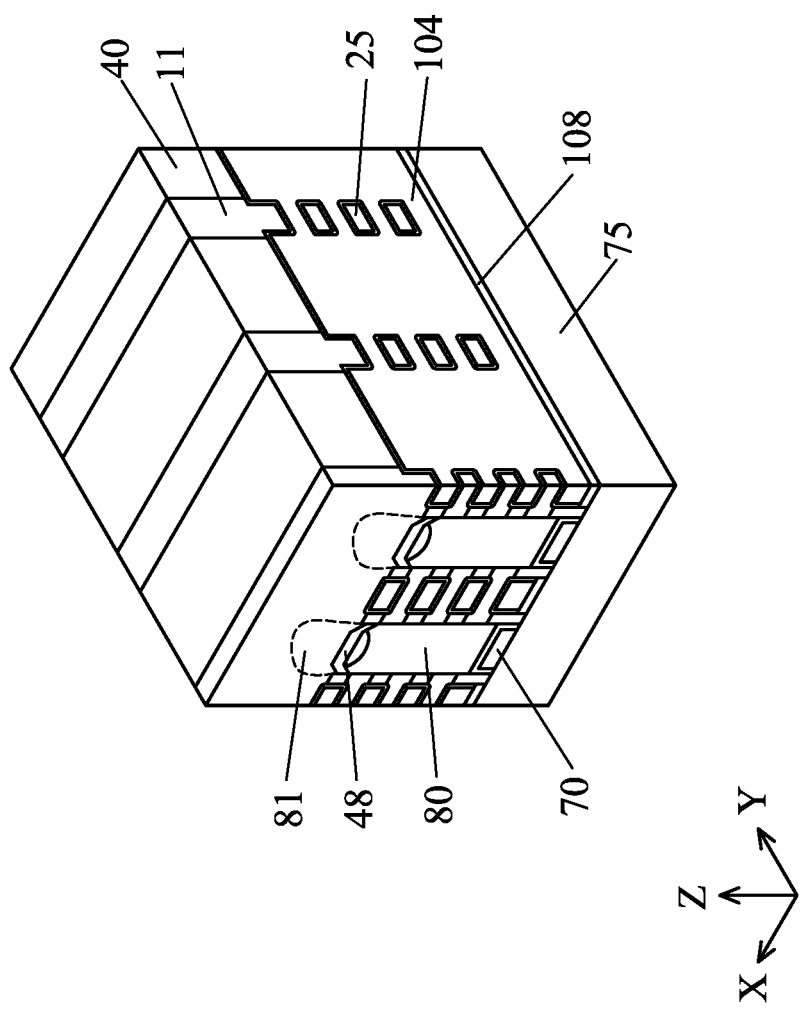

Then, the substrate/wafer is flipped for the backside processes. After the substrate is flipped over, the backside of the substate 10 is etched to expose the bottom of the isolation insulating layer 40, as shown in FIGS. 18A and 18B. FIG. 18B is a cross sectional view along Y direction cutting the source/drain epitaxial layer 80.

In some embodiments, a part of the well region (bottom fin structure) 11 is removed by over etching. In some embodiments, the remaining vertical thickness of the bottom fin structure 11 is in a range from about 20 nm to about 200 nm and is in a range from about 40 nm to about 100 nm in other embodiments.

Figure 19B:
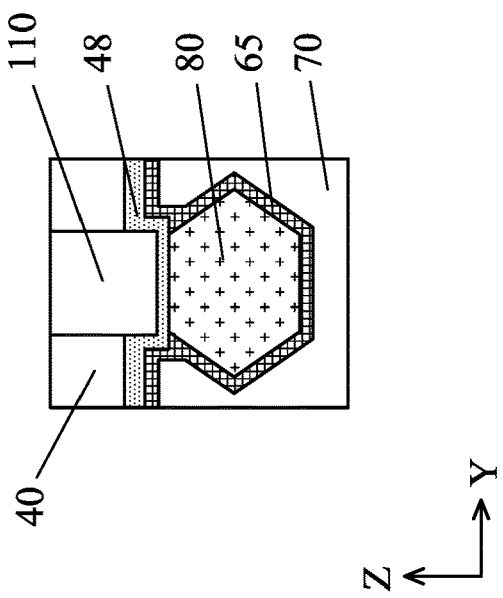
FIGS. 19A and 19B show schematic views of one of the various stages of a sequential manufacturing operation of a semiconductor device according to an embodiment of the present disclosure.
Figure 19A:
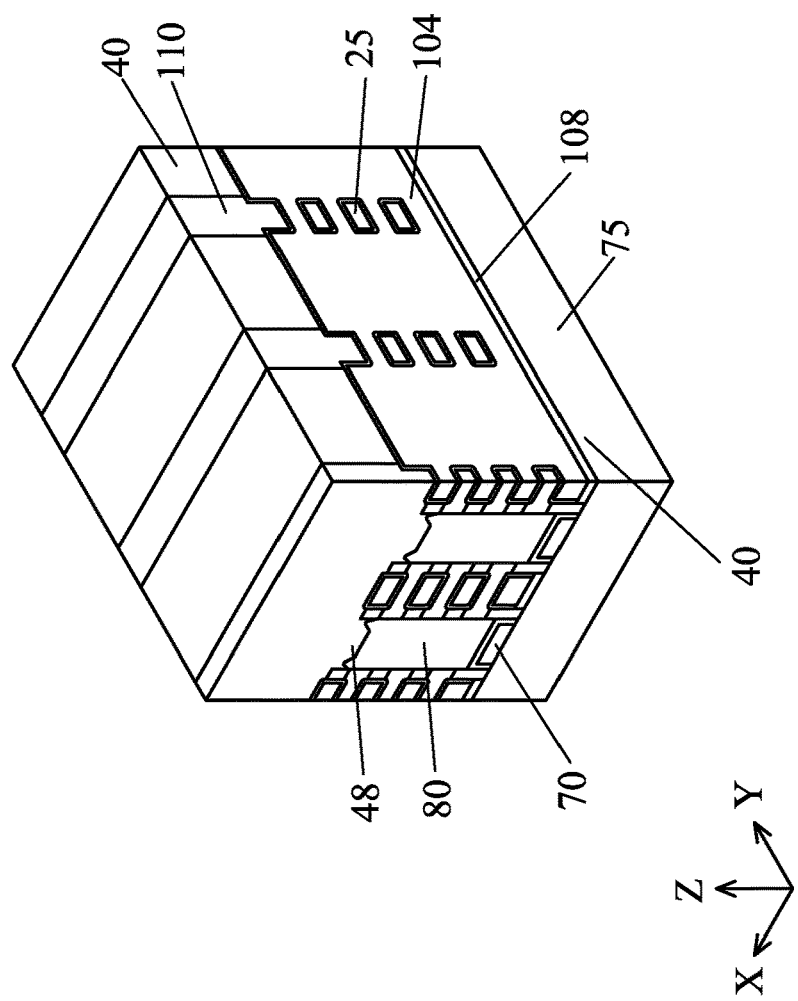

Further, the well portion 11 of the fin structure and first epitaxial layer 81 below the source/drain epitaxial layer 80 are removed, and the spaces thus formed are filled with a dielectric material 110 (dielectric fin) by using one or more deposition operations and CMP operations, as shown in FIGS. 19A and 19B. FIG. 19B is a cross sectional view along Y direction cutting the source/drain epitaxial layer 80. In some embodiments, the dielectric material 110 is made of silicon nitride, SiON, SiOCN, SiOC, SiCN or any other suitable dielectric material. In some embodiments, the vertical thickness of the dielectric material layer 110 after the CMP operation is substantially the same as the sum of the vertical thickness of the remaining bottom fin structure 11 and the vertical thickness of the first epitaxial layer 81, or is slightly (e.g., 2-10 nm) smaller than the sum.

Figure 20B:
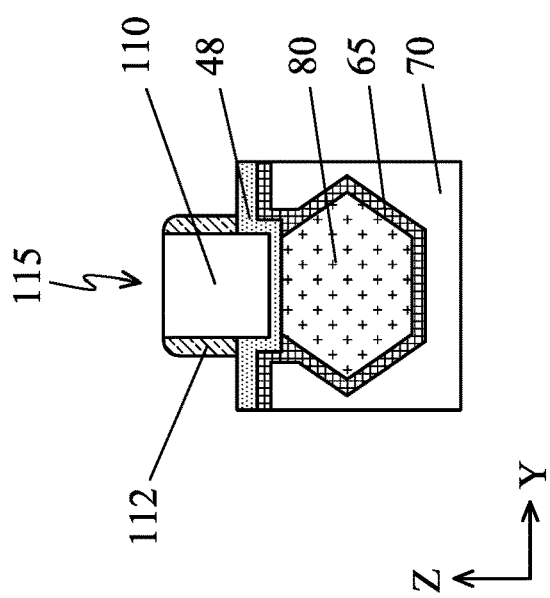
FIGS. 20A, 20B and 20C show schematic views of one of the various stages of a sequential manufacturing operation of a semiconductor device according to an embodiment of the present disclosure.
Figure 20C:
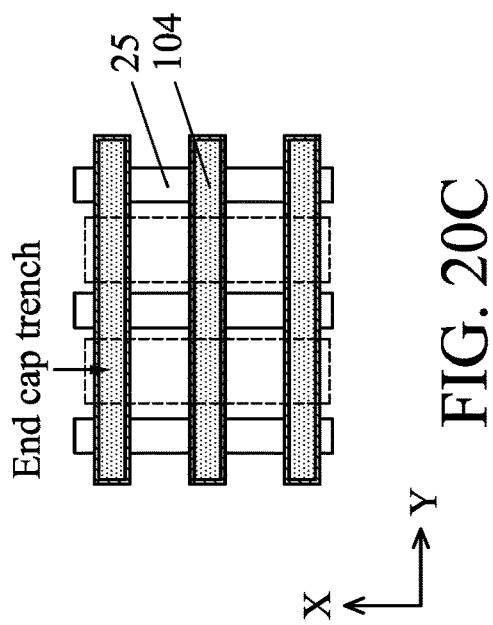
Figure 20A:
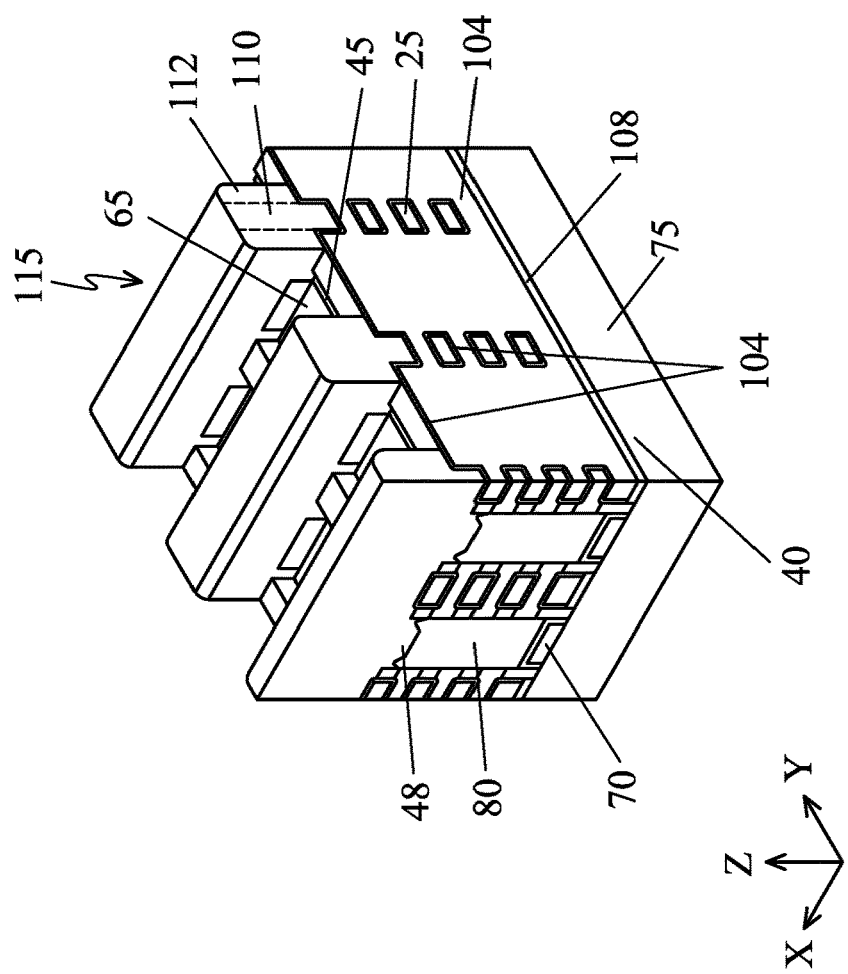

Then, as shown in FIGS. 20A-20C, an additional dielectric layer is formed over the structure of FIG. 19A and one or more etching operations are performed to form sidewall spacers as endcap insulating layers 112. Endcap trenches are formed between the endcap structures. At the bottom of the endcap trenches, part of dielectric layer 48, the gate dielectric layer 102, the gate sidewall spacers 45 and the first etch stop layer 65 are exposed.

In some embodiments, the endcap insulating layer 112 is made of silicon nitride, SiON, SiOCN, SiOC, SiCN or any other suitable dielectric material. In some embodiments, the endcap insulating layer 112 and the dielectric fin 110 are made of the same material, for example, silicon nitride. The endcap 115 (the combination of the dielectric fin 110 and the endcap insulating layers 112) is used as a hard mask in the following manufacturing operation.

Subsequently, the regions of the endcap trenches are etched to separate the metal gate structures into pieces by using the endcap 115 as an etching mask, as shown in FIGS. 21A-21C. As shown in FIG. 21A, the etching operation removes parts of the dielectric layer, the first etch stop layer 65, the ILD layer 70 and stops at the gate cap metal layer 108 as shown in FIG. 21A. In some embodiments, the etching operation removes part of the hard mask layer 75, as shown in FIG. 21D. During the etching operation, the thickness of the endcap 115 is reduced. Since the vertical thickness of the endcap 115 is sufficiently large, the endcap 115 functions as an etching mask, even if some of the layers to be etched are made of the same material as the endcap 115. In some embodiments, a part of the source/drain epitaxial layer 80 is also etched as shown in FIGS. 21A and 21B. As shown in FIG. 21B, a steep lateral profile of the etched epitaxial layer 80 improves capacitance between the metal gate 104 and the epitaxial layer 80.

Next, the gate electrode layer 104 exposed in the endcap trenches are laterally etched (trimmed). In some embodiments, the trimming amount is in a range from about 0.5 nm to about 3 nm. The trim etching causes the endcap 115 to have an overhang shape.

Figure 22B:
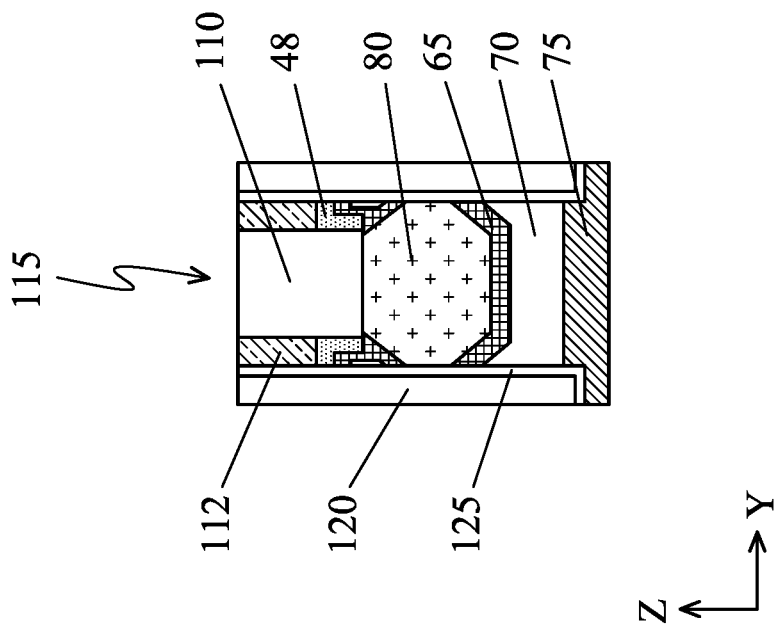
FIGS. 22A and 22B show schematic views of one of the various stages of a sequential manufacturing operation of a semiconductor device according to an embodiment of the present disclosure.
Figure 22A:
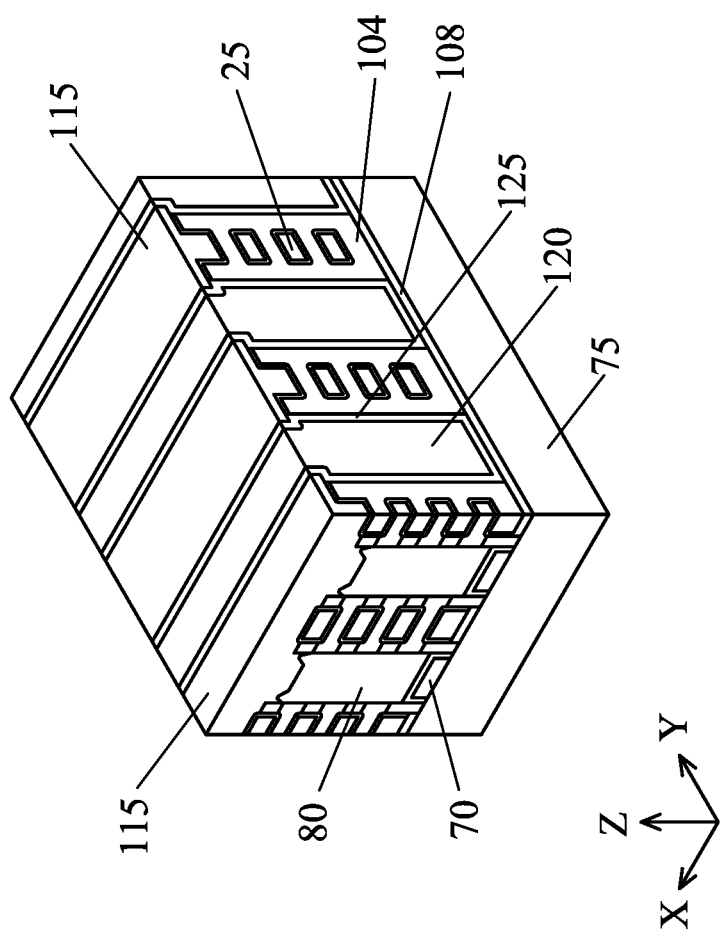

Then, as shown in FIGS. 22A and 22B, the etched portions of the endcap trenches are filled with a second ILD layer 120. FIG. 22B is a cross sectional view along Y direction cutting the source/drain epitaxial layer 80. In some embodiments, the second ILD layer 120 is made of silicon oxide, SiON, SiOCN, SiOC, SiCN or any other suitable dielectric material, different from the endcap 115. In some embodiments, before the second ILD layer 120 is formed, a second etch stop layer (ESL) 125 is conformally formed, as shown in FIGS. 22A and 22B. The second ESL 125 is made of silicon nitride, SiON or any other suitable dielectric material and has a thickness in a range from about 1 nm to about 20 nm in some embodiments. In some embodiments, silicon nitride is used.

Figure 23:
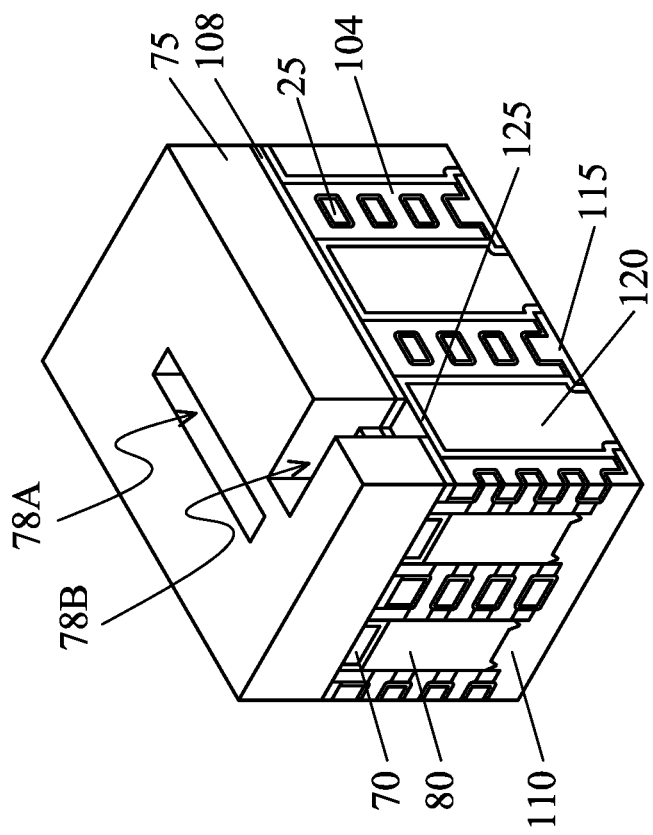
FIG. 23 shows a schematic view of one of the various stages of a sequential manufacturing operation of a semiconductor device according to an embodiment of the present disclosure.

After the second ILD layer 120 is formed, the substrate/wafer is flipped again for frontside processes. In some embodiments, openings 78A and 78B are formed in the hard mask layer 75 as shown in FIG. 23. In some embodiments, the openings 78A and 78B are for etching or cutting the gate cap metal layer 108 thereunder, and the opening 78A is for etching or cutting the gate structures 102, 104 thereunder and the second semiconductor layers 25 thereunder, where necessary.

In some embodiments, the etching of the gate cap metal layer 108 and the etching of the gate structures and the second semiconductor layer 25 are separately performed.

FIGS. 24A-24C show schematic views of the structures after etching operations to remove the gate cap metal layer 108 through the openings 78A and 78B. As shown in FIGS. 24A-24C, the gate electrode layer 104, the gate dielectric layer 102 and the second ILD layer 125 are exposed where the gate cap metal layer 108 is etched. In some embodiments, the second ILD layer 120 at the bottom of the opening 78B remains unetched as shown in FIG. 24A.

Figure 25A:
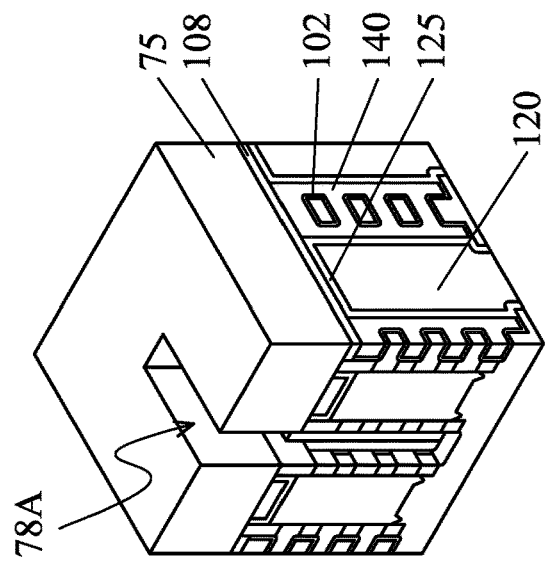
FIGS. 25A, 25B, 25C and 25D show schematic views of one of the various stages of a sequential manufacturing operation of a semiconductor device according to an embodiment of the present disclosure.
Figure 25C:
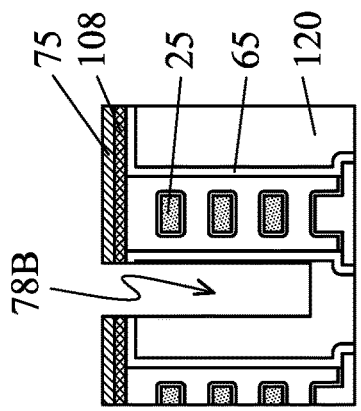
Figure 25B:
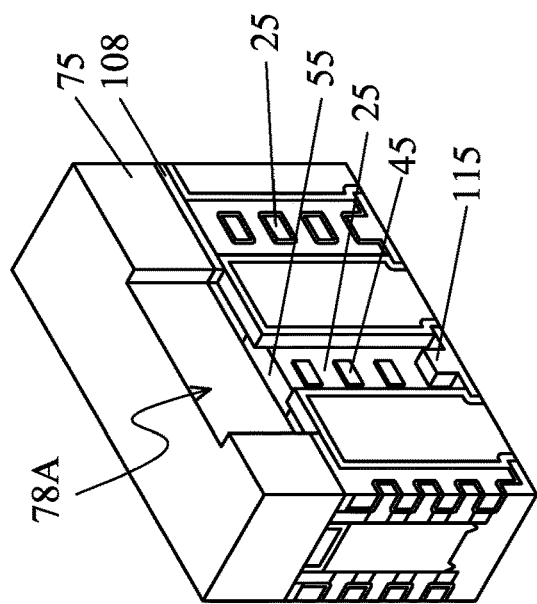
Figure 25D:
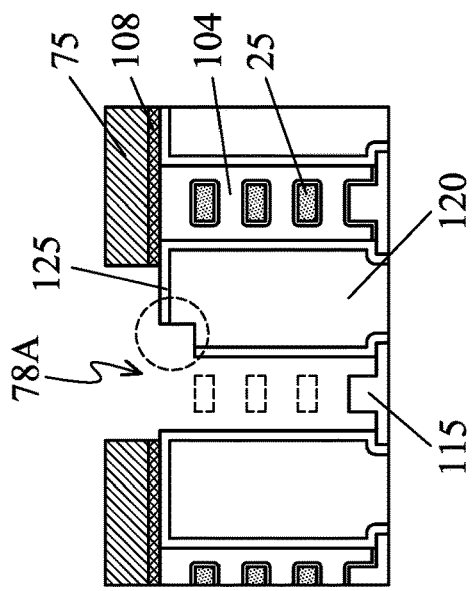

FIGS. 25A-25D show various views of the structures after etching operations to remove the gate structures 102, 104 and the second semiconductor layer 25 through the openings 78A and 78B. After the gate cap metal layer 108 is removed, the exposed gate electrode 104 and gate dielectric layer 102 are removed together with the second semiconductor layers 25. In some embodiments, the second ILD 120 is etched through the opening 78B where no gate structure is disposed thereunder, as shown in FIG. 25D. In some embodiments, a part of the second ESL layer 125 and a part of the second ILD layer 120 (the corner portion) are also etched as shown in FIG. 25B.

Figure 26B:
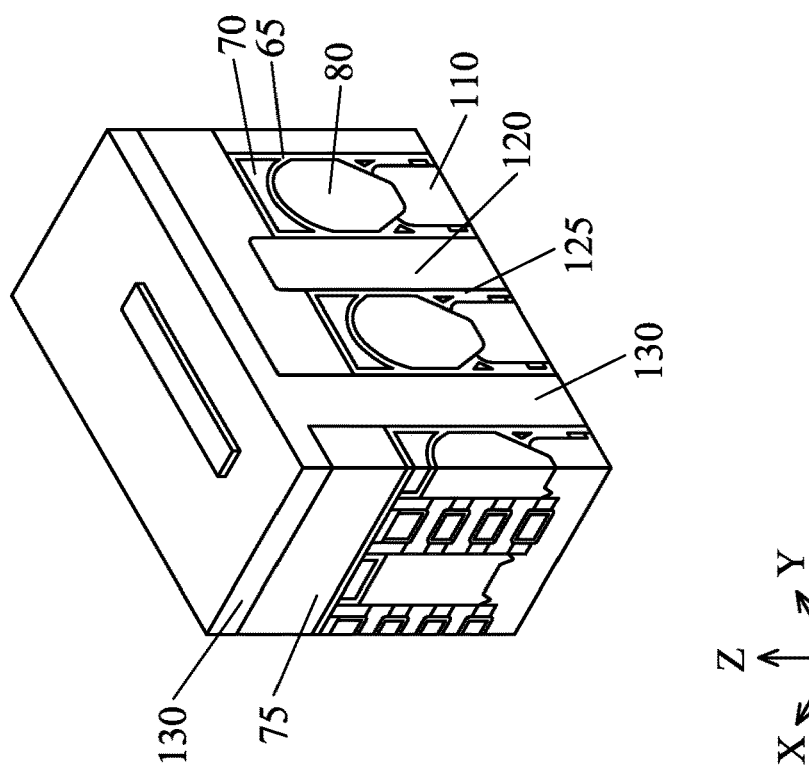
FIGS. 26A and 26B show schematic views of the various stages of a sequential manufacturing operation of a semiconductor device according to an embodiment of the present disclosure.
Figure 26A:
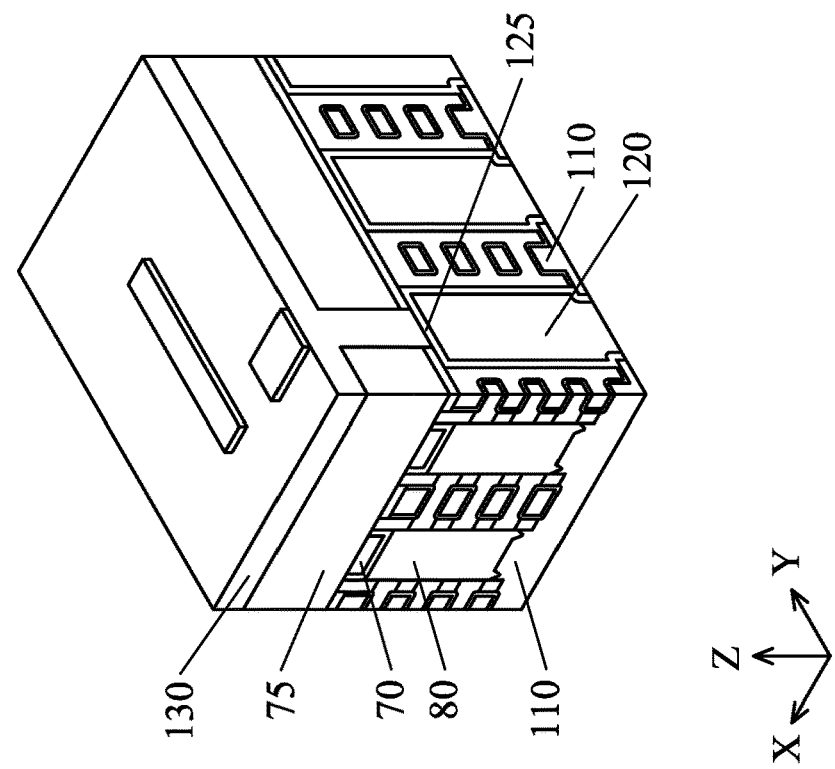

Next, as shown in FIGS. 26A and 26B, one or more dielectric layers 130 are filled in the etched portions through the openings 78A and 78B. In some embodiments, the dielectric layer 130 is made of silicon oxide, SiON, SiOCN, SiOC, SiCN or any other suitable dielectric material.

Figure 27B:
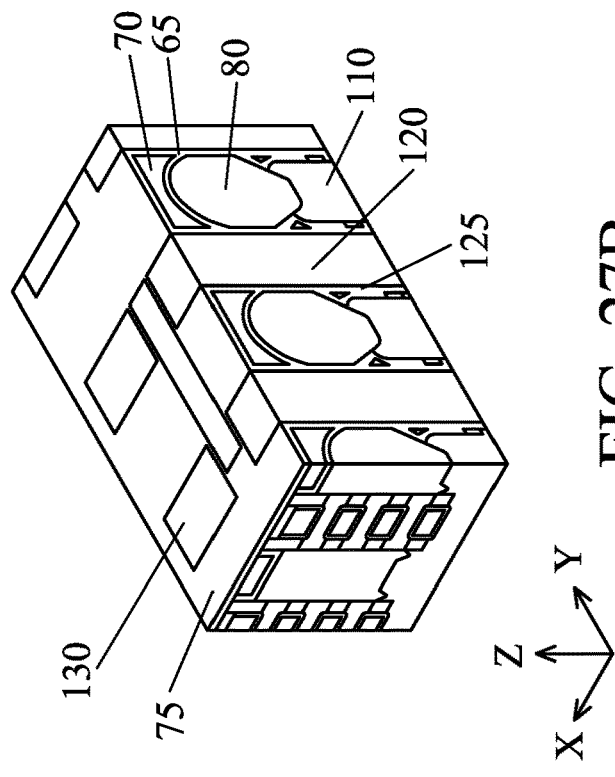
FIGS. 27A, 27B, 27C and 27D show schematic views of one of the various stages of a sequential manufacturing operation of a semiconductor device according to an embodiment of the present disclosure.
Figure 27C:
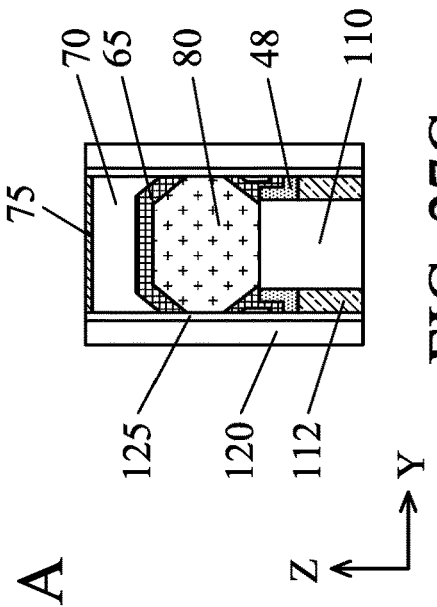
Figure 27A:
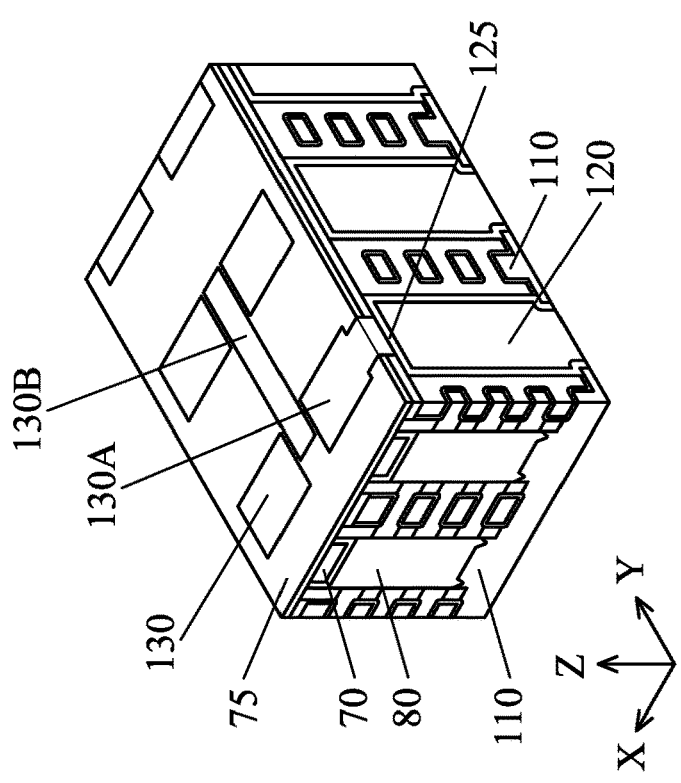
Figure 27D:
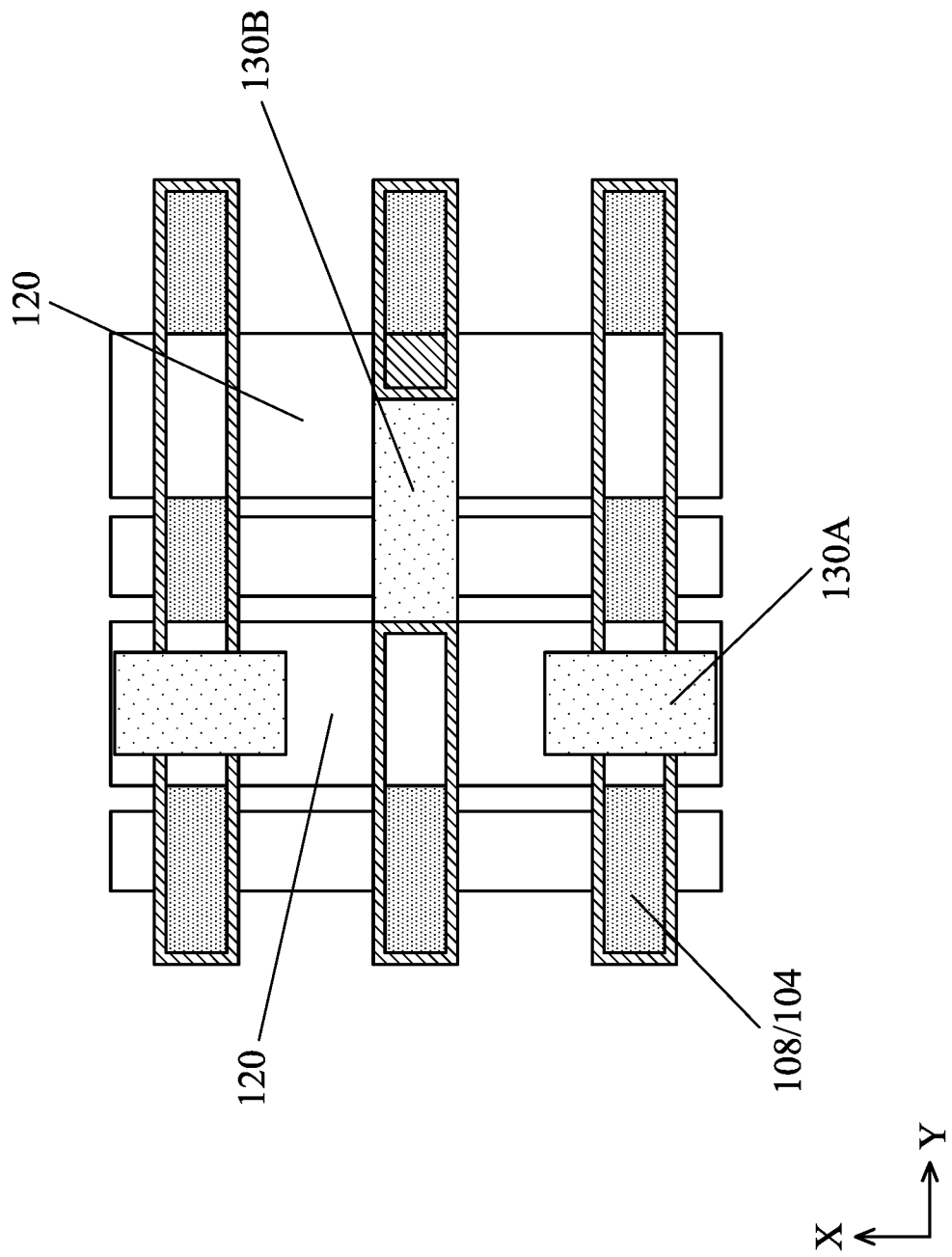

Then, one or more planarization operations (e.g., CMP) are performed to expose the hard mask layer 75, as shown in FIGS. 27A-27D. FIG. 27C is a cross sectional view along Y direction cutting the source/drain epitaxial layer 80 and FIG. 27D is a plan (or layout) view. In some embodiments, the thickness of the hard mask layer 75 is reduced.

As shown in FIGS. 27A-27D, the filled dielectric layer 130 includes a gate cut dielectric layer 130A to electrically separate the gate cap metal layers 108 of the adjacent gate structures, and a fin cut dielectric layer 130B filling a space from which an unnecessary (dummy) gate structure is removed.

Subsequently, a third ILD layer 140 is formed over the hard mask layer 75 and the dielectric material layer 130, a hard mask layer including a first hard mask layer 142 and a second hard mask layer 144 are formed, and then one or more lithography and etching operations are performed to form opening patterns 145 for source/contacts, as shown in FIG. 28. In some embodiments, the third ILD layer 140 is made of silicon oxide, SiON, SiOCN, SiOC, SiCN or any other suitable dielectric material. In some embodiments, the first hard mask layer 142 includes aluminum oxide, silicon nitride, SiON, SiC, TiN or any other suitable material. The second hard mask layer 144 is made of different material than the first hard mask layer 142 and includes silicon oxide, SiON, SiOC, SiOCN, SiON or any other suitable material.

Then, as shown in FIG. 29, dielectric materials including the third ILD layer 140, the hard mask layer 75, the first ILD layer 70 and the first etch stop layer 65, which are formed over the source/drain epitaxial layer 80, are removed by using the first and/or second hard mask layers as an etching mask, thereby forming openings 147. In some embodiments, during or before the etching of the third ILD layer 140, the second hard mask layer 144 is removed. After the openings 147 are formed in the third ILD layer 140, the first hard mask layer 142 is removed. At the bottom of the opening 147, the source/drain epitaxial layer 80 is exposed.

Next, as shown in FIG. 30, one or more conductive material layers 150 are formed in the openings 147 and over the third ILD layer 140. In some embodiments, a dielectric liner layer 152 is conformally formed on the inner sidewall of the openings 147 by deposition and anisotropic etching operations. In some embodiments, the dielectric liner layer 152 is made of silicon nitride, SiON or any other suitable material.

Further, one or more planarization operations are performed to expose the third ILD layer 140, thereby forming a source/drain contact 155 contacting the source/drain epitaxial layer 80, as shown in FIGS. 31A-31C. In some embodiments, the source/drain contact 155 is made of one or more layers of Co, Ru, Cu, W, Ni, Mo, Al, Ti or Ta or an alloy thereof. In some embodiments, before the source/drain contact 155 is formed, a silicide layer (e.g., TiSi, NiSi or CoSi) is formed on the source/drain epitaxial layer 80. In some embodiments, the source/drain contact 155 includes a barrier layer made of TiN and/or TaN having a thickness in a range from about 1.1 nm to about 5 nm and a body layer made of Co, Ru, Cu, W, Ni, Mo and/or Al. In some embodiments, no barrier layer is formed, and the body layer is a single metal layer.

As shown in FIGS. 31A and 31C, the source/drain contact 155 extends deeply below the vertical center of the source/drain epitaxial layer 80, and in such a structure, it is possible to reduce resistance of the source/drain contact 155. In some embodiments, the vertical sides of the source/drain epitaxial layer 80 is protected by the second ESL 125.

As shown in FIG. 31B, while two adjacent gate electrodes are electrically connected by the gate cap metal layer 108, the gate electrodes 104 are physically separated by the second ILD layer 120. Further, the widths W1, W2 of the gate electrode at the left and right sides of the channel (second semiconductor layer) 25 are sufficiently small and substantially the same, which reduces parasitic capacitance between the gate electrode 104 and the source/drain contact 155. In some embodiments, each of the gate electrodes covers only one group of the semiconductor sheets 25 vertically arranged over the bottom fin 110.

Figure 31E:
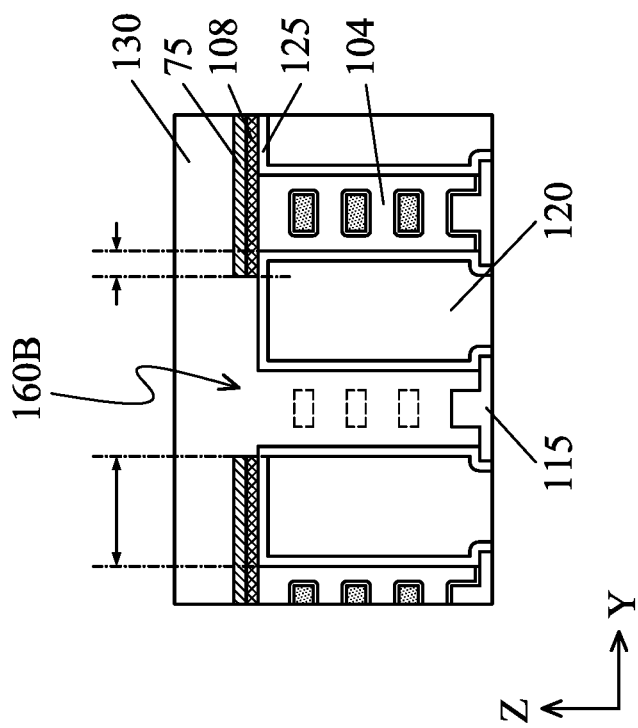
Figure 31D:
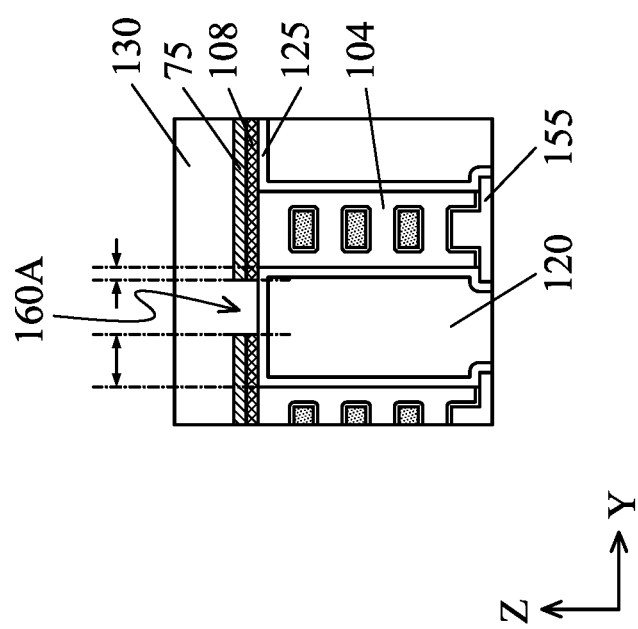

As shown in FIG. 31D, a separation area 160A between adjacent two gate electrodes separating the gate cap metal layers 108 is asymmetrically located with respect to the two gate electrodes. Similarly, as shown in FIG. 31E, a separation area 160B between two gate electrodes, where one gate structure therebetween has been removed, is asymmetrically located with respect to the two gate electrodes.

Figure 32B:
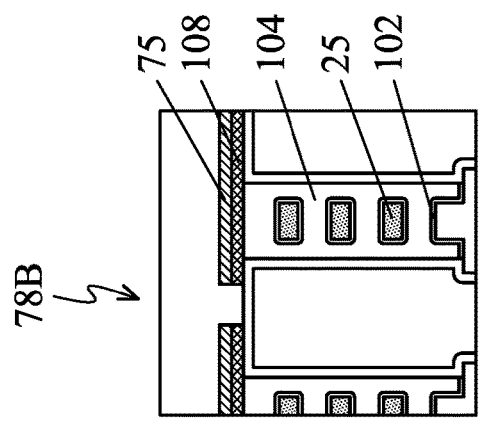
FIGS. 32A, 32B and 32C show schematic views of one of the various stages of a sequential manufacturing operation of a semiconductor device according to embodiments of the present disclosure.
Figure 32C:
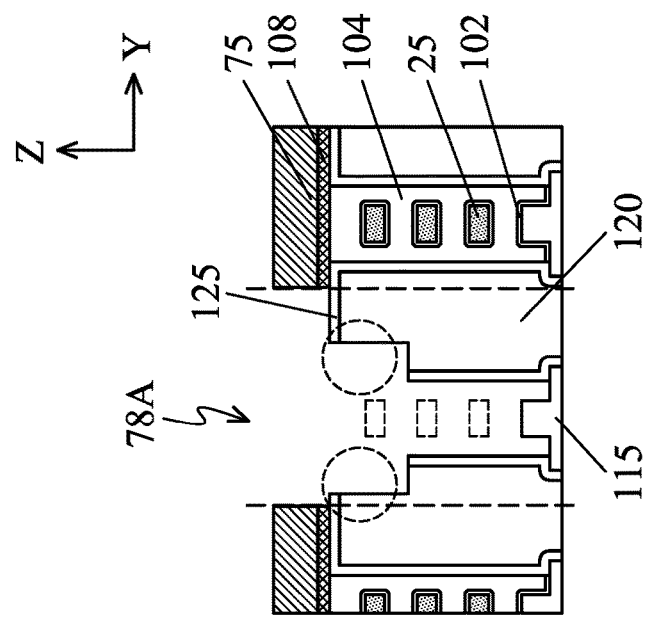
Figure 32A:
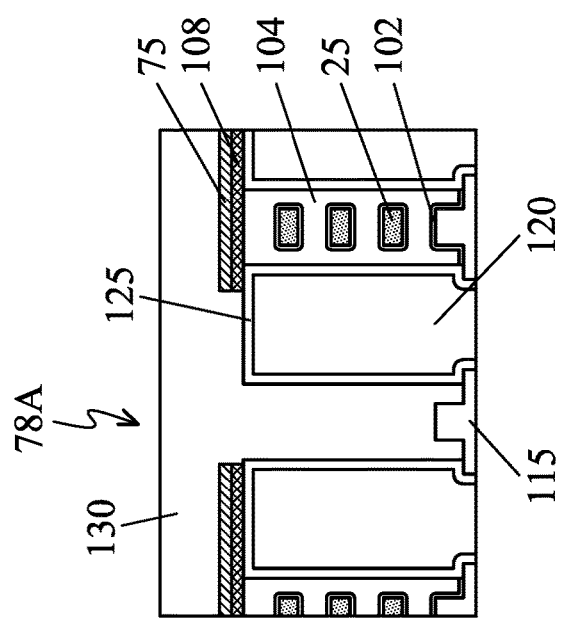

FIGS. 32A, 32B and 32C show schematic views of one of the various stages of a sequential manufacturing operation of a semiconductor device according to embodiments of the present disclosure.

In the operation shown in FIGS. 25B and 25D, a part of the second ESL 125 is etched and the second ILD layer 120 thereunder is also etched. In the embodiments shown in FIGS. 32A and 32B, the second ESL 125 is not etched, and the second ILD layer 120 is fully protected. Further, in some embodiments, as shown in FIG. 32C, a length of the opening 78A along the Y direction is greater than the case shown by FIG. 25B, and thus, two corners of the second ILD layer 125 are etched and the corresponding portions of the second ILD layer 120 are also etched.

Figure 33A:
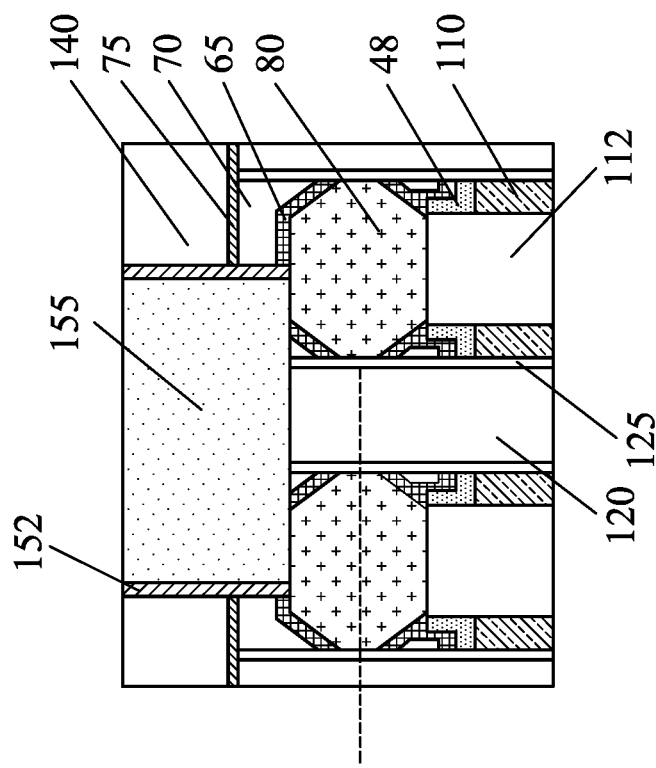
FIGS. 33A and 33B show schematic views of the various stages of a sequential manufacturing operation of a semiconductor device according to an embodiment of the present disclosure.
Figure 33B:
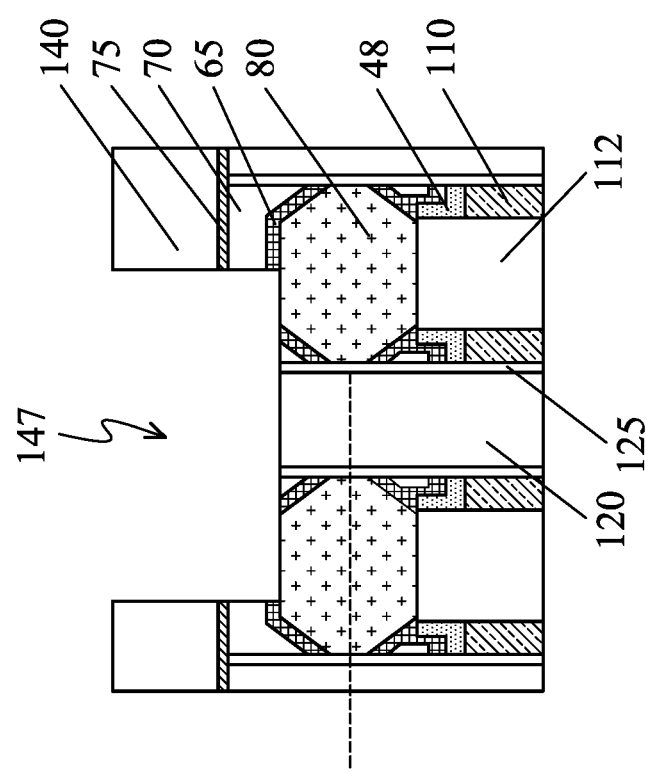

FIGS. 33A and 33B show schematic views of the various stages of a sequential manufacturing operation of a semiconductor device according to an embodiment of the present disclosure.

In the operation shown in FIGS. 33A and 33B, the opening 147 reaches a level below the source/drain epitaxial layer. In some embodiments, the level reached is lower than the center of the source/drain epitaxial layer 80 along the Z direction. In some embodiments, as shown in FIG. 33A, the etching reaches and stops at a level shallower than the center of the source/drain epitaxial layer 80. Thus, the source/drain contact 155 contacts the top portion of the source/drain epitaxial layer 80 and the side portions of the source/drain epitaxial layer 80 is protected by the second ESL 125 as shown in FIG. 33B. In this structure, it is possible to reduce parasitic capacitance of the source/drain contact 155.

It will be understood that not all advantages have been necessarily discussed herein, no particular advantage is required for all embodiments or examples, and other embodiments or examples may offer different advantages.

In accordance with an aspect of the present disclosure, in a method of manufacturing a semiconductor device, a field effect transistor (FET) structure is formed over a substrate. The FET structure includes a plurality of semiconductor sheets vertically arranged over a bottom fin structure, a gate dielectric layer wrapping around each of the plurality of semiconductor sheets, a gate electrode disposed over the gate dielectric layer and a source/drain structure. A gate cap conductive layer is formed over the gate electrode, the bottom fin structure is replaced with a dielectric fin structure, spacers are formed on opposite sides of the dielectric fin structure, a trench is formed by etching the gate electrode using the dielectric fin and the spacers as an etching mask until the gate cap conductive layer is exposed, and the trench is filled with a first dielectric material. In one or more of the foregoing and/or following embodiments, when the bottom fin structure is replaced with the dielectric fin structure, a hard mask layer is formed over the field effect transistor structures after the gate cap conductive layer is formed, the substrate is flipped upside down, the substrate and the bottom fin structure are removed, thereby forming a space, and the space is filled with a second dielectric material, thereby forming the dielectric fin structure. In one or more of the foregoing and/or following embodiments, the dielectric fin structure and the spacers are at least one of silicon nitride, SiON, SiOC, SiOCN or SiCN, respectively. In one or more of the foregoing and/or following embodiments, the dielectric fin structure and the spacers are made of a same material. In one or more of the foregoing and/or following embodiments, in the forming the trench, a part of the hard mask layer is etched. In one or more of the foregoing and/or following embodiments, in the forming the trench, a part of the source/drain structure is etched. In one or more of the foregoing and/or following embodiments, the FET structure further includes an isolation insulating layer disposed over side faces of the bottom fin structure, and after the bottom fin structure is replaced with a dielectric fin structure and before the spacers are formed, the isolation insulating layer is removed. In one or more of the foregoing and/or following embodiments, the filling the trench with the first dielectric material comprises depositing the first dielectric material in the trench and over the spacers and the dielectric fin structure, and performing a planarization operation, and a part of the spacers and the dielectric fin structure is removed by the planarization operation.

In accordance with another aspect of the present disclosure, in a method of manufacturing a semiconductor device, gate structures are formed over a substrate. Each of the gate structures includes a plurality of semiconductor sheets vertically arranged over a bottom fin structure, a gate dielectric layer wrapping around each of the plurality of semiconductor sheets, a gate electrode disposed over the gate dielectric layer. A source/drain structure is formed, a gate cap conductive layer is formed over the gate electrode, a hard mask layer is formed over the field effect transistor structures after the gate cap conductive layer is formed, the bottom fin structure is replaced with a dielectric fin structure, spacers are formed on opposite sides of the dielectric fin structure, a trench is formed by etching the gate electrode using the dielectric fin and the spacers as an etching mask until the gate cap conductive layer is exposed, the trench is filled with a first dielectric material, the hard mask layer is patterned, thereby forming a first opening and a second opening, an underling structure is removed through the first opening and the second opening, thereby forming a first trench and a second trench, and the first trench and the second trench are filled with a second dielectric material. In one or more of the foregoing and/or following embodiments, the underlying structure below the first opening to be removed includes the gate cap conductive layer and the gate structure. In one or more of the foregoing and/or following embodiments, the dielectric fin structure is exposed at a bottom of the first trench. In one or more of the foregoing and/or following embodiments, the underlying structure below the first opening to be removed includes the second dielectric material. In one or more of the foregoing and/or following embodiments, the underlying structure below the second opening to be removed includes the gate cap conductive layer and does not include the gate structure. In one or more of the foregoing and/or following embodiments, the underlying structure below the second opening to be removed includes the second dielectric material. In one or more of the foregoing and/or following embodiments, before the first trench and the second trench are filled with the second dielectric material, a liner dielectric layer is formed. The underlying structure below the first and second openings to be removed includes the gate cap conductive layer, and the liner dielectric layer protects the second dielectric material from being etched.

In accordance with another aspect of the present disclosure, in a method of manufacturing a semiconductor device, gate structures are formed over a substrate. Each of the gate structures includes a plurality of semiconductor sheets vertically arranged over a bottom fin structure, a gate dielectric layer wrapping around each of the plurality of semiconductor sheets, a gate electrode disposed over the gate dielectric layer. A source/drain epitaxial layer is formed a gate cap conductive layer is formed over the gate electrode, a hard mask layer is formed over the field effect transistor structures after the gate cap conductive layer is formed, the bottom fin structure is replaced with a dielectric fin structure, spacers are formed on opposite sides of the dielectric fin structure, a trench is formed by etching the gate electrode using the dielectric fin and the spacers as an etching mask until the gate cap conductive layer is exposed, the trench is filled with a first dielectric material, the hard mask layer is patterned, thereby forming a first opening and a second opening, an underling structure is removed through the first opening and the second opening, thereby forming a first trench and a second trench, the first trench and the second trench are filled with a second dielectric material, an interlayer dielectric layer is formed over the hard mask layer and the second dielectric material, the interlayer dielectric layer and the second dielectric material are patterned, thereby exposing a part of the source/drain epitaxial layer, and a source/drain contact is formed to contact the exposed source/drain epitaxial layer. In one or more of the foregoing and/or following embodiments, a bottom of the source/drain contact is located below a vertical center of the source/drain epitaxial layer. In one or more of the foregoing and/or following embodiments, a bottom of the source/drain contact is located above a vertical center of the source/drain epitaxial layer. In one or more of the foregoing and/or following embodiments, a bottom of the source/drain epitaxial layer is in contact with the dielectric fin structure. In one or more of the foregoing and/or following embodiments, before the source/drain contact is formed, a liner layer is formed.

In accordance with another aspect of the present disclosure, a semiconductor device includes a first gate-all-around field effect transistor (GAA FET) and a second GAA FET. Each includes a plurality of semiconductor sheets vertically arranged over a dielectric fin structure, a gate dielectric layer, a gate electrode and a source/drain epitaxial layer. The semiconductor device includes a dielectric layer disposed between the first GAA FET and the second GAA FET, and a conductive layer in contact with and connecting the gate electrode of the first GAA FET and the second GAA FET. In one or more of the foregoing and/or following embodiments, a bottom of the source/drain epitaxial layer is in contact with the dielectric fin structure. In one or more of the foregoing and/or following embodiments, the dielectric fin structure includes a center part and side parts from which the center part protrudes to the gate electrode. In one or more of the foregoing and/or following embodiments, the gate dielectric layer is disposed over the dielectric fin structure. In one or more of the foregoing and/or following embodiments, the conductive layer is made of W. In one or more of the foregoing and/or following embodiments, the conductive layer is disposed over the dielectric layer. In one or more of the foregoing and/or following embodiments, the dielectric layer includes a liner dielectric layer in contact with a side face of the gate electrode and a main dielectric layer made of a different material than the dielectric liner layer. In one or more of the foregoing and/or following embodiments, the dielectric liner layer is in contact with the conductive layer.

In accordance with another aspect of the present disclosure, a semiconductor device, includes a first gate-all-around field effect transistor (GAA FET) and a second GAA FET, each including a plurality of semiconductor sheets vertically arranged over a dielectric fin structure, a gate dielectric layer, a gate electrode, a gate cap conductive layer disposed over the gate electrode and a source/drain epitaxial layer and a dielectric layer disposed between the first GAA FET and the second GAA FET. The gate cap conductive layer laterally extends beyond the gate electrode, and the gate cap conductive layer of the first GAA FET and the gate cap conductive layer of the second GAA FET is separated by a separation insulating layer. In one or more of the foregoing and/or following embodiments, the separation insulating layer is located closer to the first GAA FET than the second GAA FET. In one or more of the foregoing and/or following embodiments, the dielectric layer includes a liner dielectric layer in contact with a side face of the gate electrode and a main dielectric layer made of a different material than the dielectric liner layer. In one or more of the foregoing and/or following embodiments, the liner dielectric layer is continuous between the first GAA FET and the second GAA FET. In one or more of the foregoing and/or following embodiments, the liner dielectric layer is discontinuous between the first GAA FET and the second GAA FET. In one or more of the foregoing and/or following embodiments, the liner dielectric layer is in contact with the dielectric fin structure. In one or more of the foregoing and/or following embodiments, a bottom of the source/drain epitaxial layer is in contact with the dielectric fin structure. In one or more of the foregoing and/or following embodiments, the dielectric fin structure includes a center part and side parts from which the center part protrudes to the gate electrode. In one or more of the foregoing and/or following embodiments, the plurality of semiconductor sheets are vertically arranged over the center part of the dielectric fin structure.

In accordance with another aspect of the present disclosure, a semiconductor device includes a first gate-all-around field effect transistor (GAA FET) and a second GAA FET, each including a plurality of semiconductor sheets vertically arranged over a dielectric fin structure, a gate dielectric layer, a gate electrode, a gate cap conductive layer disposed over the gate electrode and a source/drain epitaxial layer; a dielectric layer disposed between the first GAA FET and the second GAA FET; and a source/drain contact contacting the source/drain epitaxial layer of the first GAA FET and the source/drain epitaxial layer of the second GAA FET. The gate cap conductive layer laterally extends beyond the gate electrode. In one or more of the foregoing and/or following embodiments, a bottom of the source/drain contact is located at a level below a vertical center of the source/drain epitaxial layer. In one or more of the foregoing and/or following embodiments, a bottom of the source/drain contact is located at a level above a vertical center of the source/drain epitaxial layer.

The foregoing outlines features of several embodiments or examples so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments or examples introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A method of manufacturing a semiconductor device, comprising:
    forming a field effect transistor (FET) structure over a substrate, which includes a plurality of semiconductor sheets vertically arranged over a bottom fin structure, a gate dielectric layer wrapping around each of the plurality of semiconductor sheets, a gate electrode disposed over the gate dielectric layer and a source/drain structure;
    forming a gate cap conductive layer over the gate electrode;
    replacing the bottom fin structure with a dielectric fin structure;
    forming spacers on opposite sides of the dielectric fin structure;
    forming a trench by etching the gate electrode using the dielectric fin structure and the spacers as an etching mask until the gate cap conductive layer is exposed; and
    filling the trench with a first dielectric material.

2. The method of claim 1, wherein the replacing the bottom fin structure with the dielectric fin structure comprises:
    forming a hard mask layer over the FET structure after the gate cap conductive layer is formed;
    flipping the substrate upside down;
    removing the substrate and the bottom fin structure, thereby forming a space; and
    filling the space with a second dielectric material, thereby forming the dielectric fin structure.

3. The method of claim 2, wherein the dielectric fin structure and the spacers are at least one of silicon nitride, SiON, SiOC, SiOCN or SiCN, respectively.

4. The method of claim 3, wherein the dielectric fin structure and the spacers are made of a same material.

5. The method of claim 2, wherein in the forming the trench, a part of the hard mask layer is etched.

6. The method of claim 1, wherein in the forming the trench, a part of the source/drain structure is etched.

7. The method of claim 1, wherein:
    the FET structure further includes an isolation insulating layer disposed over side faces of the bottom fin structure, and after the bottom fin structure is replaced with the dielectric fin structure and before the spacers are formed, the isolation insulating layer is removed.

8. The method of claim 1, wherein:
    the filling the trench with the first dielectric material comprises depositing the first dielectric material in the trench and over the spacers and the dielectric fin structure, and performing a planarization operation,
    wherein a part of the spacers and the dielectric fin structure is removed by the planarization operation.

9. A method of manufacturing a semiconductor device, comprising:
    forming gate structures over a substrate, each of which includes a plurality of semiconductor sheets vertically arranged over a bottom fin structure, a gate dielectric layer wrapping around each of the plurality of semiconductor sheets, and a gate electrode disposed over the gate dielectric layer;
    forming a source/drain structure;
    forming a gate cap conductive layer over the gate electrode;
    forming a hard mask layer over the gate structures after the gate cap conductive layer is formed;
    replacing the bottom fin structure with a dielectric fin structure;
    forming spacers on opposite sides of the dielectric fin structure;
    forming a first trench by etching the gate electrode using the dielectric fin structure and the spacers as an etching mask until the gate cap conductive layer is exposed;
    filling the first trench with a first dielectric material;
    patterning the hard mask layer, thereby forming a first opening and a second opening;
    removing an underlying structure through the first opening and the second opening, thereby forming a second trench and a third trench; and
    filling the second trench and the third trench with a second dielectric material.

10. The method of claim 9, wherein the underlying structure below the first opening to be removed includes the gate cap conductive layer and a gate structure of the gate structures.

11. The method of claim 10, wherein the dielectric fin structure is exposed at a bottom of the second trench.

12. The method of claim 10, wherein the underlying structure below the first opening to be removed further includes the plurality of semiconductor sheets.

13. The method of claim 10, wherein the underlying structure below the second opening to be removed includes the gate cap conductive layer and does not include the gate structures.

14. The method of claim 13, wherein the underlying structure below the second opening to be removed further includes the first dielectric material.

15. The method of claim 9, further comprising, before the filling the second trench and the third trench with the second dielectric material, forming a liner dielectric layer, wherein:
the underlying structure below the first and second openings to be removed includes the gate cap conductive layer, and
the liner dielectric layer protects the first dielectric material from being etched.

16. A semiconductor device, comprising:
a first gate-all-around field effect transistor (GAA FET) and a second GAA FET, each including a plurality of semiconductor sheets vertically arranged over a dielectric fin structure, a gate dielectric layer, a gate electrode and a source/drain epitaxial layer;
a dielectric layer disposed between the first GAA FET and the second GAA FET; and
a conductive layer in contact with and connecting the gate electrode of the first GAA FET and the second GAA FET.

17. The semiconductor device of claim 16, wherein a bottom of the source/drain epitaxial layer is in contact with the dielectric fin structure.

18. The semiconductor device of claim 16, wherein the dielectric fin structure includes a center part and side parts from which the center part protrudes to the gate electrode.

19. The semiconductor device of claim 18, wherein the gate dielectric layer is disposed over the dielectric fin structure.

20. The semiconductor device of claim 16, wherein the conductive layer is made of tungsten (W).

* * * * *